(12) United States Patent
Misaki

(10) Patent No.: US 9,215,800 B2
(45) Date of Patent: Dec. 15, 2015

(54) TOUCH PANEL, DISPLAY DEVICE INCLUDING THE TOUCH PANEL, AND METHOD OF MANUFACTURING THE TOUCH PANEL

(75) Inventor: Katsunori Misaki, Yonago (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 204 days.

(21) Appl. No.: 13/991,487

(22) PCT Filed: Dec. 2, 2011

(86) PCT No.: PCT/JP2011/006773
§ 371 (c)(1),
(2), (4) Date: Jun. 4, 2013

(87) PCT Pub. No.: WO2012/077320
PCT Pub. Date: Jun. 14, 2012

(65) Prior Publication Data
US 2013/0258614 A1 Oct. 3, 2013

(30) Foreign Application Priority Data
Dec. 9, 2010 (JP) .................................. 2010-274981

(51) Int. Cl.
*H05K 1/02* (2006.01)
*G06F 3/044* (2006.01)

(52) U.S. Cl.
CPC .............. *H05K 1/0298* (2013.01); *G06F 3/044* (2013.01); *G06F 2203/04103* (2013.01); *G06F 2203/04111* (2013.01)

(58) Field of Classification Search
CPC .................. H05K 1/0298; G06F 3/044; G06F 2203/04111; G06F 2203/04103
USPC .................. 345/173–174; 361/748; 430/319; 427/97.3; 257/E21.002; 438/48
See application file for complete search history.

(56) References Cited

U.S. PATENT DOCUMENTS

| 2008/0165158 A1* | 7/2008 | Hotelling et al. ............. 345/174 |
| 2010/0026661 A1 | 2/2010 | Teramoto |
| 2010/0066709 A1* | 3/2010 | Yajima .......................... 345/204 |
| 2010/0171718 A1* | 7/2010 | Denda ........................... 345/173 |

(Continued)

FOREIGN PATENT DOCUMENTS

| CN | 101639580 A | 2/2010 |
| CN | 101776967 A | 7/2010 |

(Continued)

OTHER PUBLICATIONS

Official Communication issued in International Patent Application No. PCT/JP2011/006773, mailed on Mar. 6, 2012.

*Primary Examiner* — Alexander Eisen
*Assistant Examiner* — Abhishek Sarma
(74) *Attorney, Agent, or Firm* — Keating & Bennett, LLP

(57) ABSTRACT

A external connecting terminal (35) includes a first interconnect layer (36A) formed of a same film as a first conductive pattern for touch position detection under an interlayer insulating film (23), and a second interconnect layer (36B) formed of a same film as a second conductive pattern for touch position detection on the interlayer insulating film (23). the first and the second interconnect layers are electrically connected to a lead line (31) at a portion overlapping the lead line (31), and electrically connected together at a portion outside the lead line (31).

11 Claims, 36 Drawing Sheets

(56) References Cited

U.S. PATENT DOCUMENTS

2011/0134075 A1* 6/2011 Takusa ............................ 345/174
2011/0169761 A1* 7/2011 Sakai et al. ..................... 345/173
2011/0199320 A1* 8/2011 Cho et al. ....................... 345/173

FOREIGN PATENT DOCUMENTS

JP          2009-87118 A        4/2009
WO     WO 2010016174 A1 *   2/2010

* cited by examiner

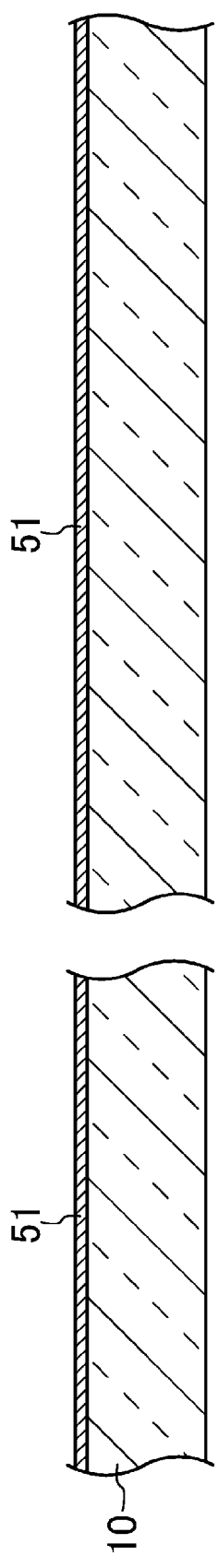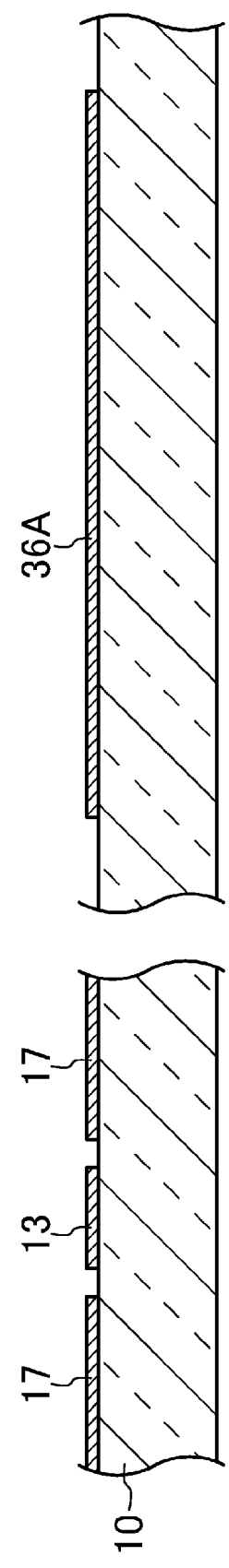

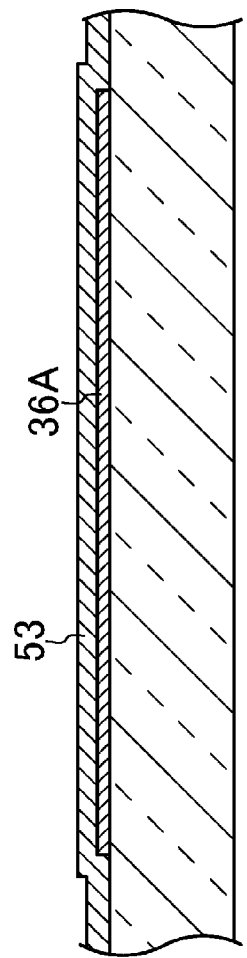
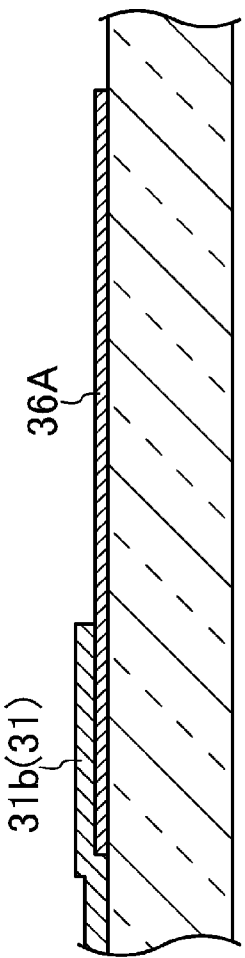
FIG.12A
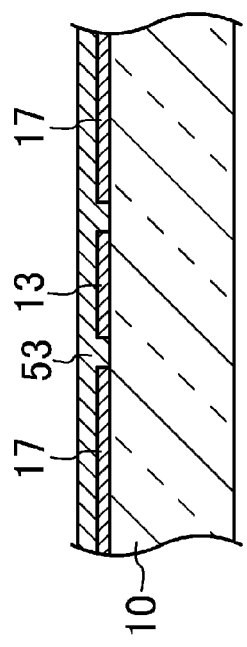
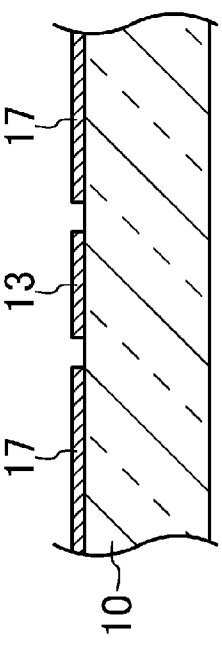
FIG.12B

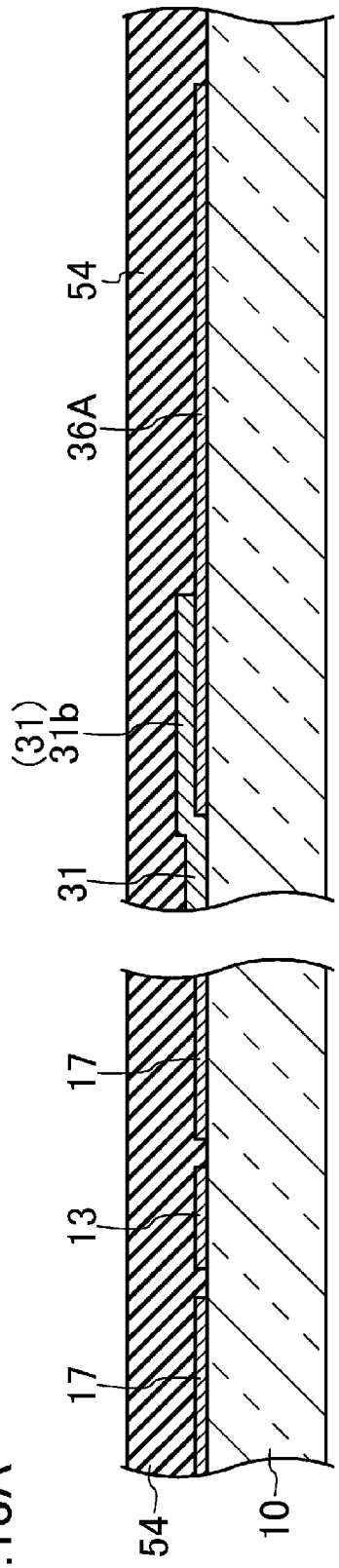
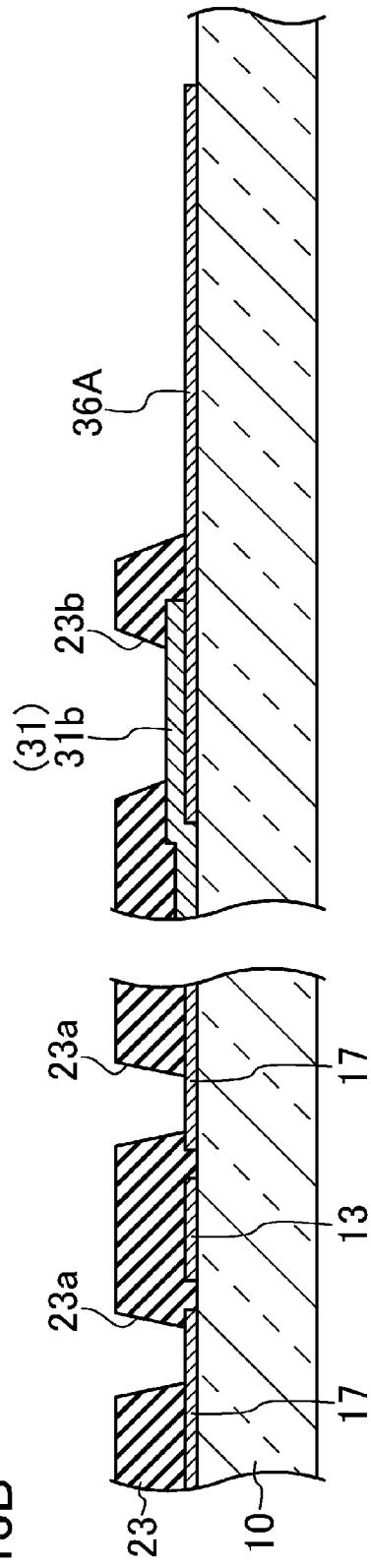

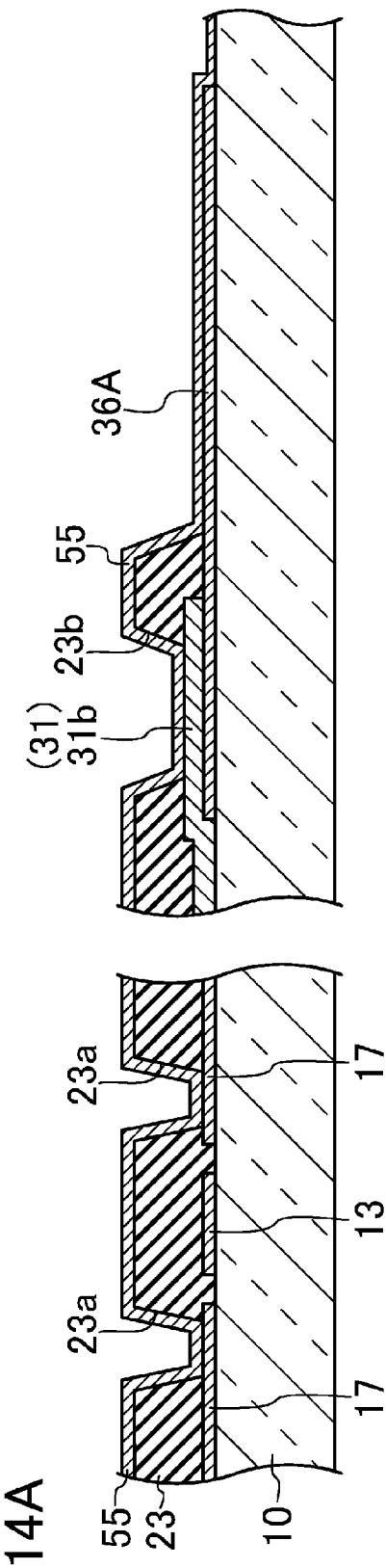
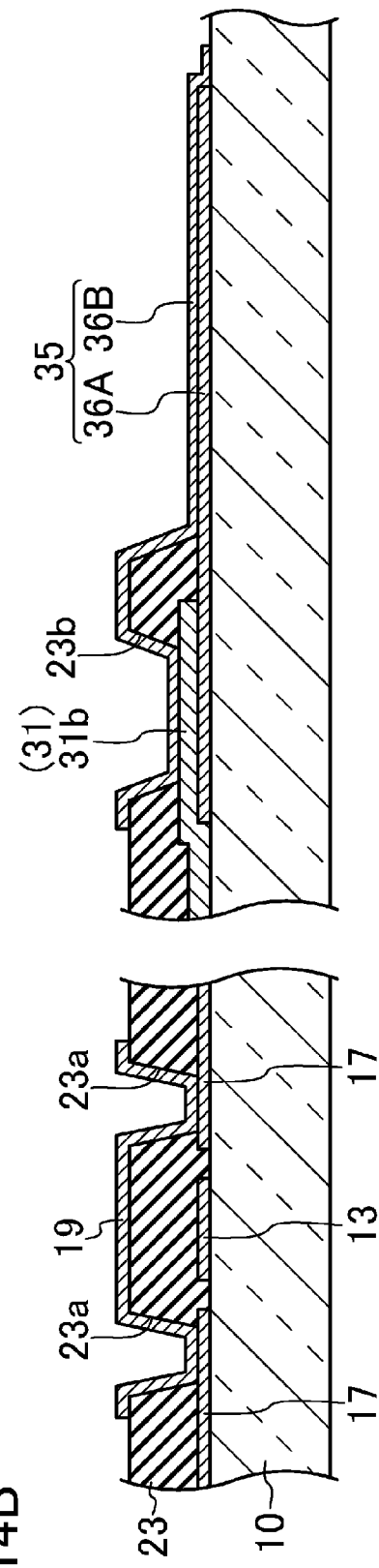
FIG.14A
FIG.14B

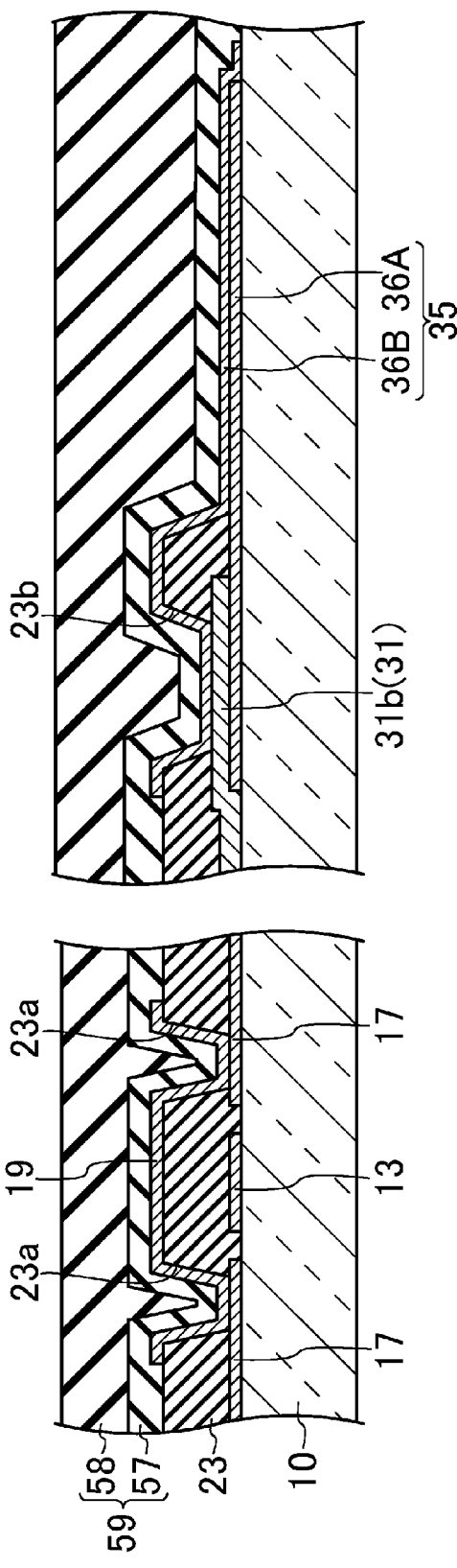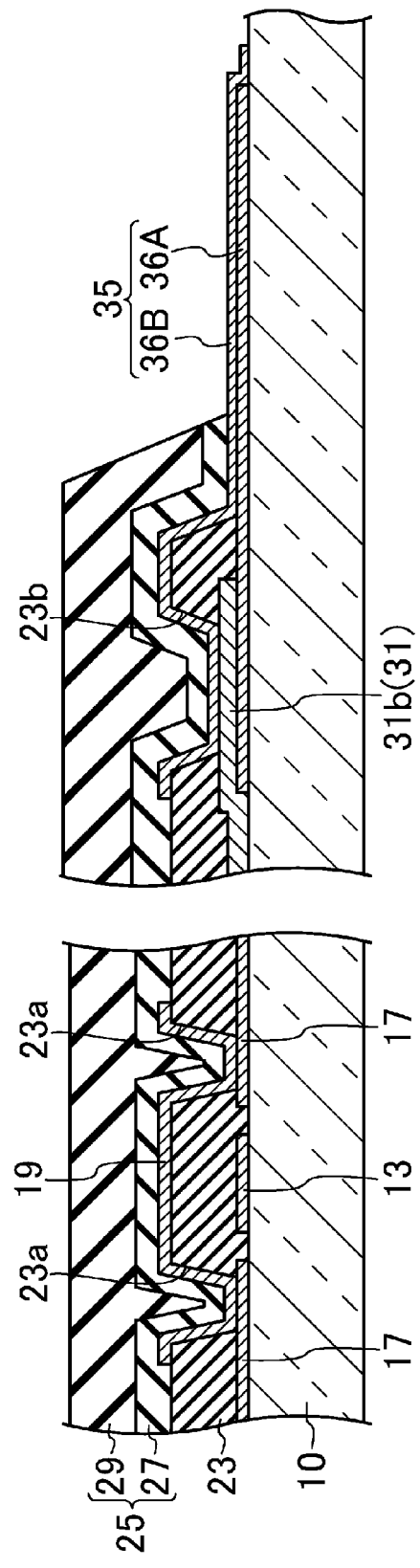

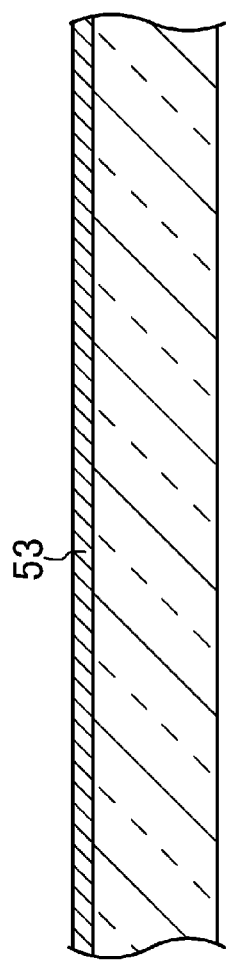
FIG.29A
FIG.29B

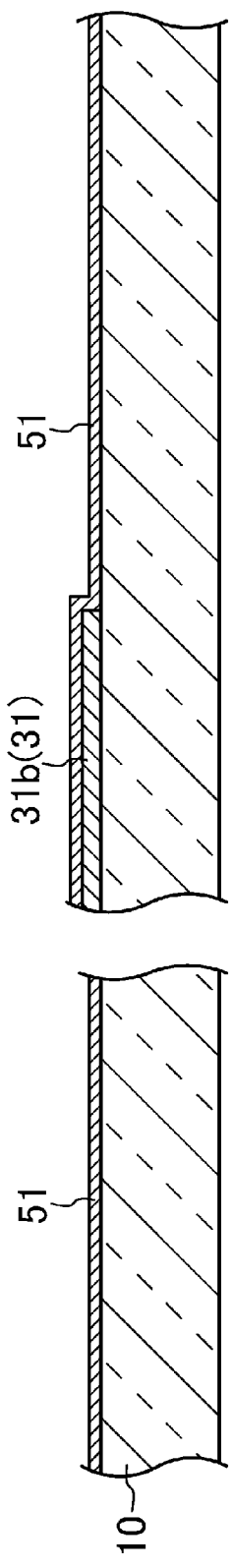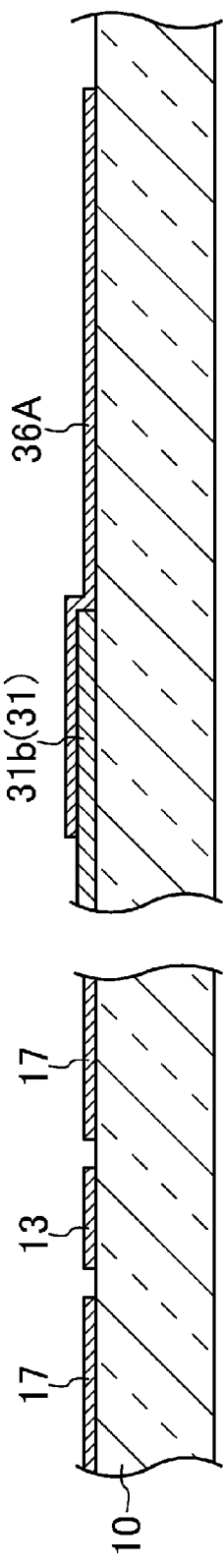

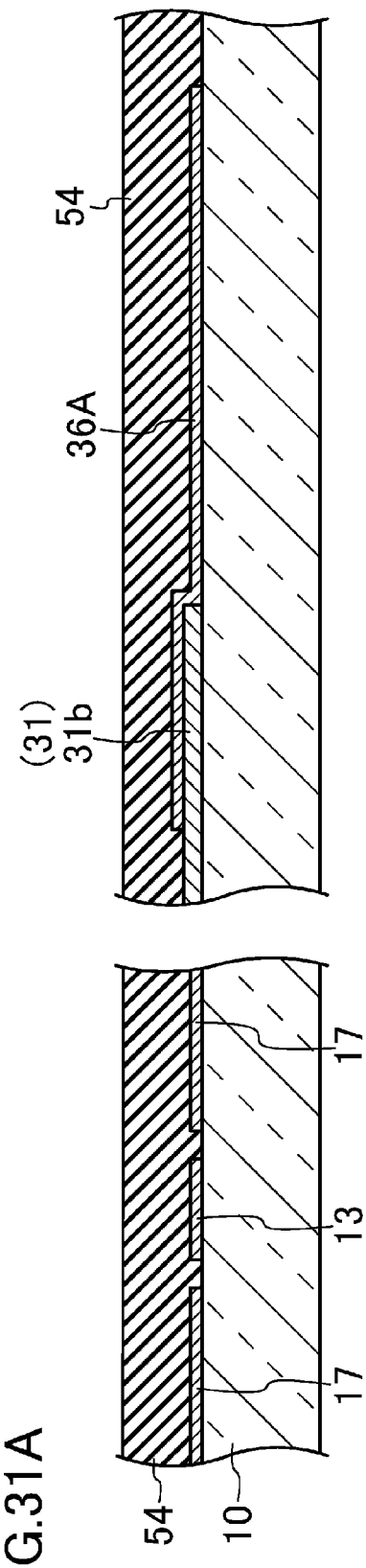
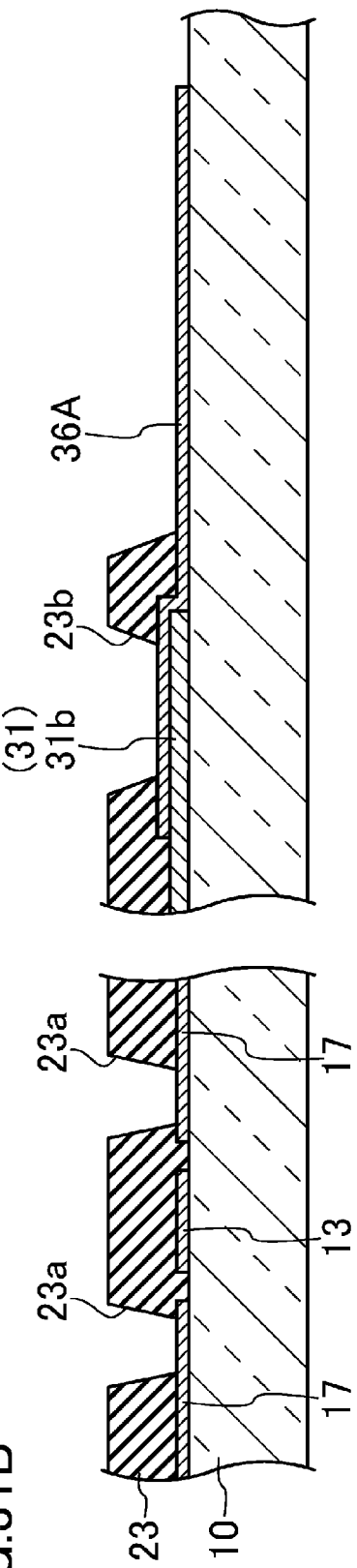
FIG.31A
FIG.31B

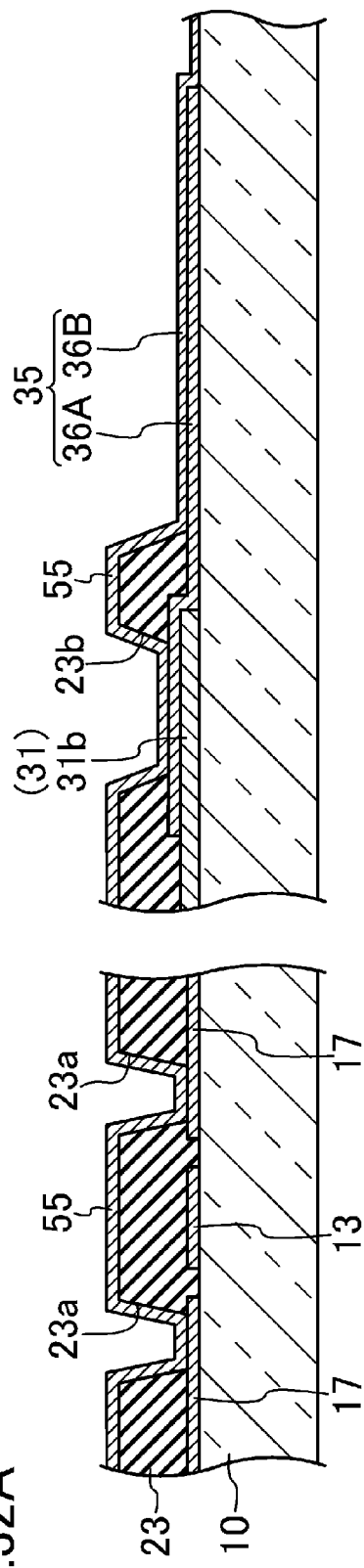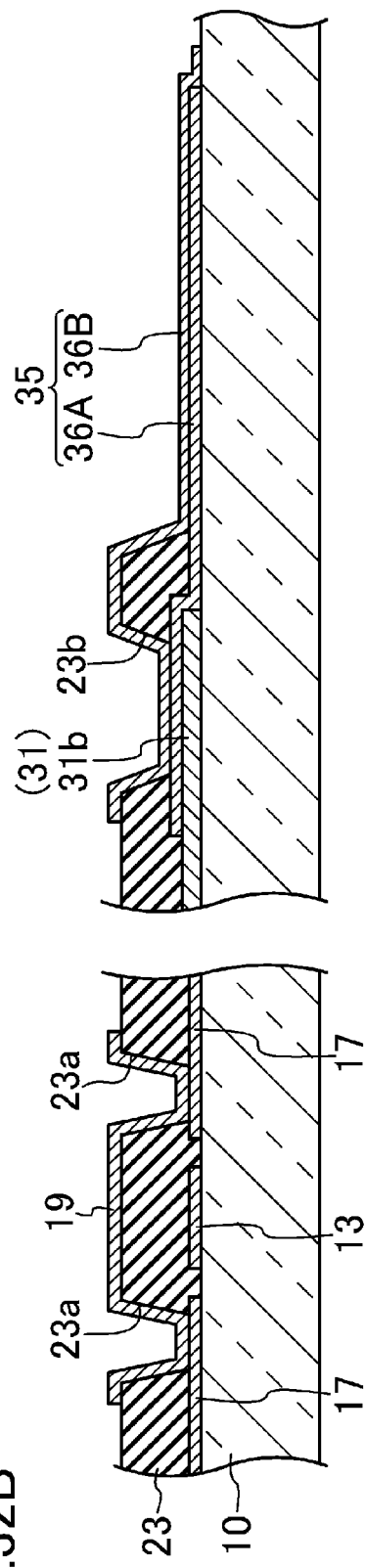
FIG.32A
FIG.32B

TOUCH PANEL, DISPLAY DEVICE INCLUDING THE TOUCH PANEL, AND METHOD OF MANUFACTURING THE TOUCH PANEL

TECHNICAL FIELD

The present disclosure relates to touch panels, display devices including the touch panels, and methods of manufacturing the touch panels, and more particularly to measures against deterioration in detection of touch positions.

BACKGROUND ART

A touch panel is an input device provided on a display panel such as a liquid crystal display panel and a plasma display panel to form a display device, and inputting information to the body of the display device by performing various types of operation on a screen of the display panel using a finger, a pen, etc.

Touch panels are classified into resistive-film, capacitive, infrared, ultrasonic wave, electromagnetic induction touch panels, etc., depending on their principles of operation. Of these, capacitive touch panels are relatively less likely to lose the optical characteristics of display devices, and are thus known as suitable for the display devices. In particular, projected capacitive touch panels are capable of multipoint detection of contact bodies such as fingers, and has thus excellent control characteristics of inputting complicated instructions.

In a touch region of a projected capacitive touch panel, which detects touch positions, a plurality of first electrode groups are arranged in parallel, each of which includes a plurality of first electrodes aligned in one direction, and a plurality of second electrode groups are arranged in parallel, each of which includes a plurality of second electrodes aligned in the direction orthogonal to the first electrode groups, as electrodes for touch position detection. The first electrodes and the second electrodes are made of transparent conductive oxide such as indium tin oxide (hereinafter referred to as ITO) having low conductivity to make the screen of the display panel see-through.

Each adjacent pair of the first electrodes of the first electrode groups is connected by a first connecting portion. Each adjacent pair of the second electrodes of the second electrode groups is connected by a second connecting portion. The first connecting portion and the second connecting portion are made of transparent conductive oxide, similar to the first electrodes and the second electrodes. In each of intersections between the first electrode groups and the second electrode groups, the first connecting portion and the second connecting portion are provided with an interlayer insulating film interposed therebetween to be insulated from each other. The first electrode groups and the second electrode groups are electrically connected to different lead lines drawn from the touch region to a terminal region located outside the touch region.

An external connecting terminal is provided at the top of each lead line. Each external connecting terminal is connected to a capacitance detection circuit, which applies AC voltages to the corresponding first and second electrode groups, and detects the capacitance at the portions corresponding to the first electrodes and the second electrodes. Each of the first electrodes, the second electrodes, and the lead lines are covered by a protective insulating film.

In this touch panel, when the insulating film is touched in the touch region, ones of the first electrodes and the second electrodes in the touch position are grounded via a capacitance generated between the electrodes and a contact body such as a finger, and via a human body. At this time, a change in the capacitance generated between the contact body and the ones of the first and second electrodes in the touch position is detected by the capacitance detection circuit. In this way, the touch position is detected based on the change in the capacitance.

In the terminal region of such a projected capacitive touch panel, numbers of external connecting terminals are densely arranged. The external connecting terminals need to be exposed from the insulating film to be connected to the external terminals, and thus are occasionally made of transparent conductive oxide such as ITO, which is resistant to moisture and heat, and less corroded, as well as electrodes for touch position detection as an anti-corrosion measure. (See, for example, PATENT DOCUMENT1.)

CITATION LIST

Patent Document

PATENT DOCUMENT1: Japanese Patent Application No. 2009-87118

SUMMARY OF THE INVENTION

Technical Problem

In the above-described projected capacitive touch panel, however, since numbers of external connecting terminals are densely provided in a terminal region, a width of each of the external connecting terminals inevitably decrease. In addition, where the external connecting terminals are made of transparent conductive oxide such as ITO, the electrical resistance of the external connecting terminals is relatively high, since the conductivity of the transparent conductive oxide is lower than the conductivity of metal such as copper (Cu) and aluminum (Al), which is used as a conventional interconnect material. Therefore, poor conduction occurs between the electrodes for touch position detection and the capacitance detection circuit, thereby damaging the function of touch position detection.

However, where the external connecting terminals are made of a material having higher conductivity than the electrodes for touch position detection, a step of forming the external connecting terminals needs to be added individually from the step of forming the electrodes for touch position detection, thereby increasing the manufacturing steps to increase the manufacturing costs.

The present disclosure was made in view of the foregoing, and it is an objective of the present disclosure to reduce the electrical resistance of external connecting terminals without increasing the manufacturing costs to provide an excellent function of touch position detection.

Solution to the Problem

In order to achieve the objective, in the present disclosure, an external connecting terminal has a parallel connection structure of two layers connected in parallel to a lead line, and the parallel connection structure is formed of the same film as existing conductive patterns for touch position detection located on and under an interlayer insulating film.

Specifically, the present disclosure provides a touch panel, a display device including the touch panel, and a method of manufacturing the touch panel. The touch panel includes a touch region for detecting a touch position touched by a contact body; a terminal region provided outside the touch region and connected to an external circuit; a first conductive pattern for touch position detection located in the touch region and made of transparent conductive oxide; an interlayer insulating film provided to cover at least part of the first conductive pattern; a second conductive pattern for touch position detection provided on the interlayer insulating film and made of transparent conductive oxide; a protection insulating film provided to cover the second conductive pattern; a lead line electrically connected to at least one of the first conductive pattern or the second conductive pattern, drawn from the touch region to the terminal region, and covered by the insulating film; and an external connecting terminal connected to a lead top of the lead line, drawn outside the insulating film, and provided in the terminal region. The present disclosure provides the following solution.

Specifically, in the touch panel according to a first aspect of the invention, the external connecting terminal a first interconnect layer formed of a same film as the first conductive pattern, and a second interconnect layer formed of a same film as the second conductive pattern, the first and the second interconnect layers being electrically connected to the lead line at a portion overlapping the lead line and electrically connected together at a portion outside the lead line.

In this first aspect of the invention, the external connecting terminal has a parallel connection structure of the first interconnect layer and the second interconnect layer, which are connected in parallel to the lead line. The electrical resistance of the parallel connection structure is the sum of the inverse of the electrical resistance value of the first interconnect layer and the inverse of the electrical resistance value of the second interconnect layer. This reduces the electrical resistance of the external connecting terminal as compared to the case where the external connecting terminal is a single layer connected in series to the lead line and made of transparent conductive oxide.

The first interconnect layer is formed of the same film as the first conductive pattern, and the second interconnect layer is formed of the same film as the second conductive pattern. That is, the external connecting terminal can have the above-described parallel connection structure by utilizing the existing steps of forming the first conductive pattern and the second conductive pattern. Thus, there is no need to add a step of forming the external connecting terminal independently from the steps of forming the first conductive pattern and the second conductive pattern not to increase the manufacturing steps.

Therefore, according to the first aspect of the invention, the electrical resistance of the external connecting terminal decreases without increasing the manufacturing costs to obtain an excellent function of touch position detection.

According to a second aspect of the invention, in the touch panel according to the first aspect of the invention, the first interconnect layer and the second interconnect layer are stacked one on another in the terminal region.

In this second aspect of the invention, the external connecting terminal has the multilayer of the first interconnect layer and the second interconnect layer in the terminal region. In this multilayer portion, the external connecting terminal is thick as compared to the case where the external connecting terminal is a single layer made of transparent conductive oxide, since the portion has one layer more to form the external connecting terminal. This greatly reduces the resistance of the external connecting terminal.

According to a third aspect of the invention, in the touch panel according to the first or second aspect of the invention, a contact hole or a cutout portion is formed in the interlayer insulating film at a portion overlapping the lead top of the lead line, and the second interconnect layer is electrically connected to the lead line via the contact hole or the cutout portion.

In this third aspect of the invention, the second interconnect layer is electrically connected to the lead line via the contact hole or the cutout portion formed in the interlayer insulating film. In the region other than the portion with the contact hole or the cutout portion, the lead line is covered by the interlayer insulating film in addition to the protection insulating film. Being covered by the two insulating films of the interlayer insulating film and the protection insulating film, the lead line blocks entry of moisture etc., thereby greatly preventing corrosion of the lead line.

According to a fourth aspect of the invention, in the touch panel according to any one of the first to third aspects of the invention, the lead top of the lead line extends outside the insulating film, and at least one of the first interconnect layer or the second interconnect layer covers an entire extending portion of the lead line.

In this fourth aspect of the invention, the portion of the lead line extending outside the insulating film is covered by the first interconnect layer or the second interconnect layer. Thus, although being located outside the interlayer insulating film, the extending portion of the lead line is protected from moisture etc., by the first interconnect layer or the second interconnect layer covering the extending portion, and is less corroded. In this structure, in which the lead top of the lead line extends outside the insulating film, the width of a picture-frame region outside the touch region can be reduced as compared to the structure in which the entire lead line is inside the insulating film.

According to a fifth aspect of the invention, in the touch panel according to any one of the first to fourth aspects of the invention, the first interconnect layer and the second interconnect layer are electrically connected to the lead line at different portions.

This fifth aspect of the invention specifically provides the effects and advantages of the present disclosure.

According to a sixth aspect of the invention, in the touch panel according to any one of the first to fifth aspects of the invention, the lead line is formed by stacking a first interconnect layer formed of a same film as the first conductive pattern, and a second interconnect layer made of a metal material.

In this sixth aspect of the invention, the lead line has the multilayer of the first interconnect layer and the second interconnect layer. This lead line having the multilayer is thick as compared to the case where the lead line is a layer made of only a metal material corresponding to that of the second interconnect layer, since the multilayer has one layer (i.e., the first interconnect layer) more to form the lead line. This reduces the resistance of the lead line.

In addition, the first interconnect layer is formed of the same film as the first conductive pattern. That is, the lead line can have the above-described multilayer by utilizing the existing step of forming the first conductive pattern not to increase the manufacturing steps.

According to a seventh aspect of the invention, in the touch panel according to any one of the first to sixth aspects of the invention, one of the first conductive pattern or the second conductive pattern includes a plurality of first electrode groups arranged in parallel, each including a plurality of first electrodes aligned in one direction, a plurality of second electrode groups arranged in parallel, each including a plurality of second electrodes aligned in a direction intersecting the first electrode groups, and a first connecting portion connecting each adjacent pair of the first electrodes of the first electrode groups. The other one of the first conductive pattern or the second conductive pattern includes a second connecting portion connecting each adjacent pair of the second electrodes of the second electrode groups.

In this seventh aspect of the invention, a projected capacitive touch panel can be specifically implemented. In the touch panel, the first electrode groups and the second electrode groups are provided in the same layer, thereby causing a change in the capacitance generated between a contact body such as a finger and the first and second electrodes in the touch position to the same extent. This reduces the difference in the sensitivity of the change in the capacitance between the first electrodes and the second electrodes, thereby enabling highly sensitive detection of the touch position.

According to an eighth aspect of the invention, in the touch panel according to any one of the first to seventh aspects of the invention, the transparent conductive oxide forming the first conductive pattern and the second conductive pattern is ITO or indium zinc oxide (hereinafter referred to as IZO).

In this eighth aspect of the invention, the first conductive pattern and the second conductive pattern are made of ITO or IZO. ITO and IZO have conductivity and relatively high transparency to make the touch region transparent, and the screen of the display panel greatly see-through.

In this eighth aspect of the invention, the first interconnect layer and the second interconnect layer in the external connecting terminal are also made of ITO or IZO. Since ITO and IZO are resistant to moisture etc. and are less corroded as compared to metal such as copper (Cu) and aluminum (Al), which is often used as an interconnect material, the external connecting terminal has excellent resistance to corrosion.

A ninth aspect of the invention provides a display device including the touch panel of any one of the first to the eighth aspects of the invention.

In this ninth aspect of the invention, the touch panel according to the first to eighth aspect of the invention has great characteristics of reducing the electrical resistance of the external connecting terminal without increasing the manufacturing costs to provide an excellent function of touch position detection. Thus, a display device, which accurately inputs information by performing various types of control using a contact body such as a finger or a pen, is provided at low costs.

According to a tenth aspect of the invention, in the display device according to the ninth aspect of the invention, the touch panel is directly formed on a substrate surface forming a display panel.

In this tenth aspect of the invention, since the touch panel is directly formed on the substrate surface forming the display panel, the display device, which includes the touch panel having an excellent function of touch position detection, is formed thin as a whole.

An eleventh aspect of the invention provides a method of manufacturing the touch panel of according to the first aspect of the invention. The method includes a first patterning step of forming the first conductive pattern and the first interconnect layer by forming a transparent conductive film made of transparent conductive oxide on a base substrate, and patterning the transparent conductive film using a first photomask; a second patterning step of forming the lead line to be connected to the first interconnect layer by forming a metal film to cover the first conductive pattern and the first interconnect layer, and patterning the metal film using a second photomask; a third patterning step of forming the interlayer insulating film to expose at least part of the first interconnect layer and the lead line by forming an insulating film to cover the first conductive pattern, the first interconnect layer, and the lead line, and patterning the insulating film using a third photomask; a fourth patterning step of forming the second conductive pattern, and forming the second interconnect layer to be connected to the first interconnect layer and the lead line by forming a transparent conductive film made of transparent conductive oxide on the interlayer insulating film, and patterning the transparent conductive film using a fourth photomask; and a fifth patterning step of forming the protection insulating film to expose at least part of the second interconnect layer by forming an insulating film to cover the second conductive pattern and the second interconnect layer, and patterning the insulating film using a fifth photomask.

In this eleventh aspect of the invention, in the first patterning step, the first conductive pattern and the first interconnect layer are formed of the same film using the single photomask. In the second patterning step, the second conductive pattern and the second interconnect layer are formed of the same film using the single photomask. As such, the first interconnect layer and the second interconnect layer are formed utilizing the existing steps of forming the first conductive pattern and the second conductive pattern, and the external connecting terminal can have the above-described parallel connection structure without increasing the manufacturing steps. This reduces the electrical resistance of the external connecting terminal without increasing the manufacturing costs to manufacture the touch panel according to the first aspect of the invention, which has an excellent function of touch position detection.

A twelfth aspect of the invention provides a method of manufacturing the touch panel according to the first aspect of the invention. The method includes a first patterning step of forming the lead line by forming a metal film on a base substrate, and patterning the metal film using a first photomask; a second patterning step of forming the first conductive pattern, and forming the first interconnect layer to partially overlap and to be connected to the lead line by forming a transparent conductive film made of transparent conductive oxide to cover the lead line, and patterning the transparent conductive film using a second photomask; a third patterning step of forming the interlayer insulating film to expose at least part of the lead line or the first interconnect layer at a portion overlapping the lead line, and at least part of the first interconnect layer at a portion outside the lead line by forming an insulating film to cover the lead line, the first conductive pattern, and the first interconnect layer, and patterning the insulating film using a third photomask; a fourth patterning step of forming the second conductive pattern, and forming the second interconnect layer to be connected to the lead line or the first interconnect layer at a portion overlapping the lead line, and to the first interconnect layer at a portion outside the lead line by forming a transparent conductive film made of transparent conductive oxide on the interlayer insulating film, and patterning the transparent conductive film using a fourth photomask; and a fifth patterning step of forming the protection insulating film to expose at least part of the second interconnect layer by forming an insulating film to cover the second conductive pattern and the second interconnect layer, and patterning the insulating film using a fifth photomask.

In this twelfth aspect of the invention, the first interconnect layer and the second interconnect layer are formed utilizing the existing steps of forming the first conductive pattern and the second conductive pattern, and the external connecting terminal can have the above-described parallel connection structure without increasing the manufacturing steps. This reduces the electrical resistance of the external connecting terminal without increasing the manufacturing costs to manufacture the touch panel according to the first aspect of the invention, which has an excellent function of touch position detection.

Advantages of the Invention

In the present disclosure, the external connecting terminal has the parallel connection structure of the first interconnect layer and the second interconnect layer, which are connected in parallel to the lead line, and the parallel connection structure is formed of the same film as the existing first and second conductive patterns for touch position detection located on and under the interlayer insulating film. This reduces the electrical resistance of the external connecting terminal without increasing the manufacturing costs to provide an excellent function of touch position detection. As a result, poor conduction between the conductive patterns for touch position detection and external circuits can be prevented, thereby providing at low costs, a display device accurately inputting information by performing various types of operation using a contact body such as a finger or a pen.

BRIEF DESCRIPTION OF THE DRAWINGS

FIGS. 11A and 11B are cross-sectional views illustrating portions corresponding to FIGS. 5 and 9 in a first patterning step of the method of manufacturing the touch panel according to the first embodiment.

FIGS. 12A and 12B are cross-sectional views illustrating the portions corresponding to FIGS. 5 and 9 in a second patterning step of the method of manufacturing the touch panel according to the first embodiment.

FIGS. 13A and 13B are cross-sectional views illustrating the portions corresponding to FIGS. 5 and 9 in a third patterning step of the method of manufacturing the touch panel according to the first embodiment.

FIGS. 14A and 14B are cross-sectional views illustrating the portions corresponding to FIGS. 5 and 9 in a fourth patterning step of the method of manufacturing the touch panel according to the first embodiment.

FIGS. 15A and 15B are cross-sectional views illustrating the portions corresponding to FIGS. 5 and 9 in a fifth patterning step of the method of manufacturing the touch panel according to the first embodiment.

FIGS. 29A and 29B are cross-sectional views illustrating portions corresponding to FIG. 5 and the right of FIG. 28 in a first patterning step of a method of manufacturing the touch panel according to the second embodiment.

FIGS. 30A and 30B are cross-sectional views illustrating the portions corresponding to FIG. 5 and the right of FIG. 28 in a second patterning step of the method of manufacturing the touch panel according to the second embodiment.

FIGS. 31A and 31B are cross-sectional views illustrating the portions corresponding to FIG. 5 and the right of FIG. 28 in a third patterning step of the method of manufacturing the touch panel according to the second embodiment.

FIGS. 32A and 32B are cross-sectional views illustrating the portions corresponding to FIG. 5 and the right of FIG. 28 in a fourth patterning step of the method of manufacturing the touch panel according to the second embodiment.

DESCRIPTION OF EMBODIMENTS

Embodiments of the present disclosure will be described hereinafter in detail with reference to the drawings. The present disclosure is not limited to the following embodiments.

First Embodiment of Invention

In this first embodiment, a liquid crystal display device S including a liquid crystal display panel DP as a display panel will be described as an example display device.

Structure of Liquid Crystal Display Device S

Figure 1:
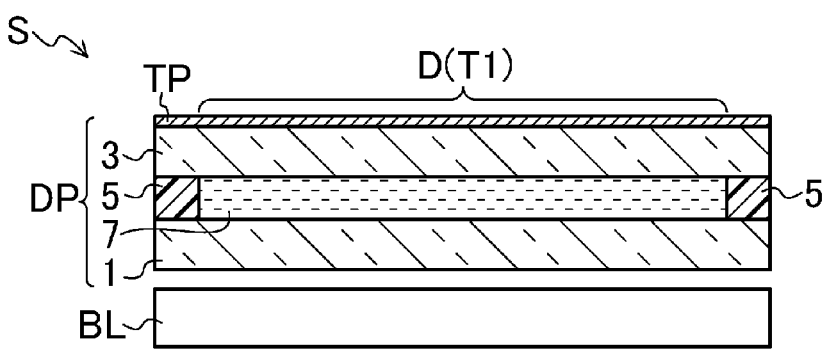
FIG. 1 is a cross-sectional view illustrating the cross-sectional structure of a liquid crystal display device according to a first embodiment.

FIG. 1 illustrates the cross-sectional structure of the liquid crystal display device S.

The liquid crystal display device S is a transmissive liquid crystal display device with a touch panel TP, and includes the liquid crystal display panel DP, a back light unit BL, which is a light source device provided above the back surface of the liquid crystal display panel DP, and the touch panel TP provided on the front surface of the liquid crystal display panel DP, i.e., opposite to the back light unit BL.

Structure of Liquid Crystal Display Panel DP

The liquid crystal display panel DP includes a thin film transistor (hereinafter referred to as TFT) substrate 1 and a counter substrate 3, which face each other, a frame-like sealing material 5, which bonds the peripheral edges of the TFT substrate 1 and the counter substrate 3 together, and a liquid crystal layer 7 encapsulated between the TFT substrate 1 and the counter substrate 3, and surrounded by the sealing material 5.

This liquid crystal display panel DP has a display region D displaying images in a region, in which the TFT substrate 1 overlaps the counter substrate 3, at the inner side of the sealing material 5, i.e., in the region provided with the liquid crystal layer 7. The display region D is formed by arranging a plurality of pixels, which are minimum units of an image, in a matrix. The liquid crystal display panel DP has, outside the display region D, a terminal region (not shown), in which the TFT substrate 1 extends beyond the counter substrate 3 and is exposed to the outside. In this terminal region, integrated circuit chips and circuit boards are mounted with anisotropic conductive films etc. interposed therebetween, and signals for display are input from an external circuit to the liquid crystal display panel DP.

Although not shown, the TFT substrate 1 includes, on an insulating substrate such as a glass substrate, which is a base substrate, a plurality of gate interconnects extending in parallel, a plurality of source interconnects extending in parallel in the direction intersecting the gate interconnects, TFTs provided at respective intersections between the gate interconnects and the source interconnects to correspond to the pixels, and pixel electrodes connected to the drains of the TFTs. The on/off state of the TFTs is switched, thereby selectively applying potential to the pixel electrodes corresponding to the TFTs.

Although not shown, the counter substrate 3 includes, on an insulating substrate 10 such as a glass substrate, which is a base substrate, a black matrix provided in a lattice to correspond to the gate interconnects and the source interconnects, a plurality of color filters of red layers, green layers, and blue layers, which are periodically arranged within the lattice of the black matrix to correspond to the pixels, a common electrode provided to cover the black matrix and the color filters and facing a group of the pixel electrodes, and a photo spacer provided in a pillar on the common electrode.

The TFT substrate 1 and the counter substrate 3 are formed, for example, in a rectangle shape, and provided with alignment films (not shown) on the inner surfaces facing each other. Polarizing plates (not shown) are provided on the outer surface of the TFT substrate 1, and the outer surface of the touch panel TP located on the counter substrate 3. The liquid crystal layer 7 is made of a nematic liquid crystal material etc. having electro-optical characteristics.

Structure of Back Light Unit BL

Although not shown, the back light unit BL includes a light source such as a light-emitting diode (LED) and a cold cathode fluorescent tube, a light guide plate, and a plurality of optical sheets such as prism sheets; and emits light, which is incident from the light source to the light guide plate, as light with a uniform plane from a light-emitting surface of the light guide plate to the liquid crystal display panel DP via the optical sheets.

Display Operation of Liquid Crystal Display Device S

In each pixel of the liquid crystal display panel DP having the above-described structure, when a gate signal is sent to the gate of one of the TFTs via a gate interconnect to turn on the TFT, a source signal is sent to the source of the TFT via a source interconnect to write predetermined charge in the corresponding one of the pixel electrodes via the TFT. At this time, a potential difference arises between the pixel electrode of the TFT substrate 1 and the common electrode of the counter substrate 3, thereby applying a predetermined voltage to the liquid crystal layer 7. In the liquid crystal display device S, the alignment of liquid crystal molecules changes depending on the magnitude of the voltage applied to the liquid crystal layer 7 to control the transmittance of the light from the back light unit BL in the liquid crystal layer 7, thereby displaying an image.

Structure of Touch Panel TP

Figure 2:
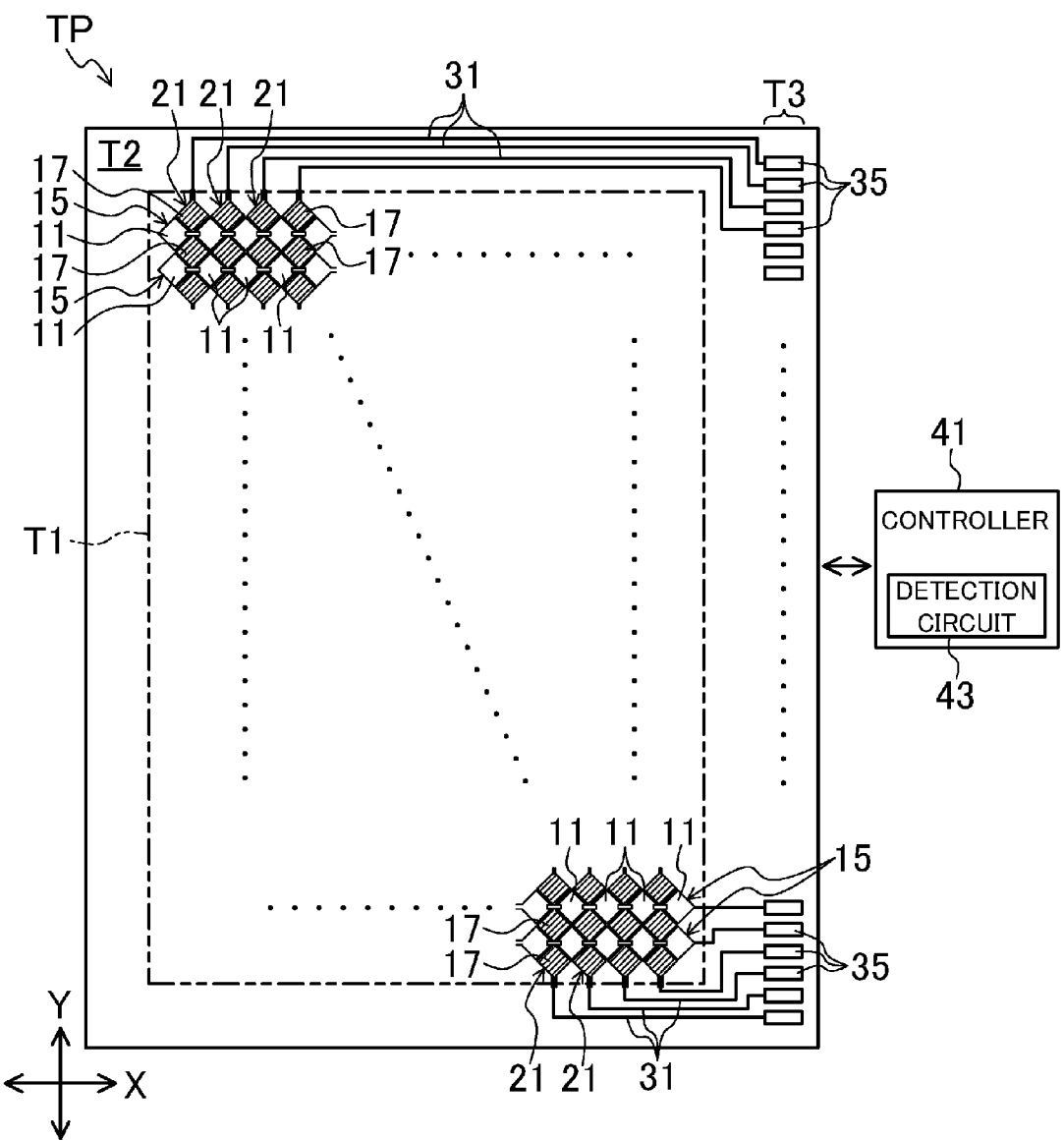
FIG. 2 is a top view schematically illustrating a touch panel according to the first embodiment.
Figure 3:
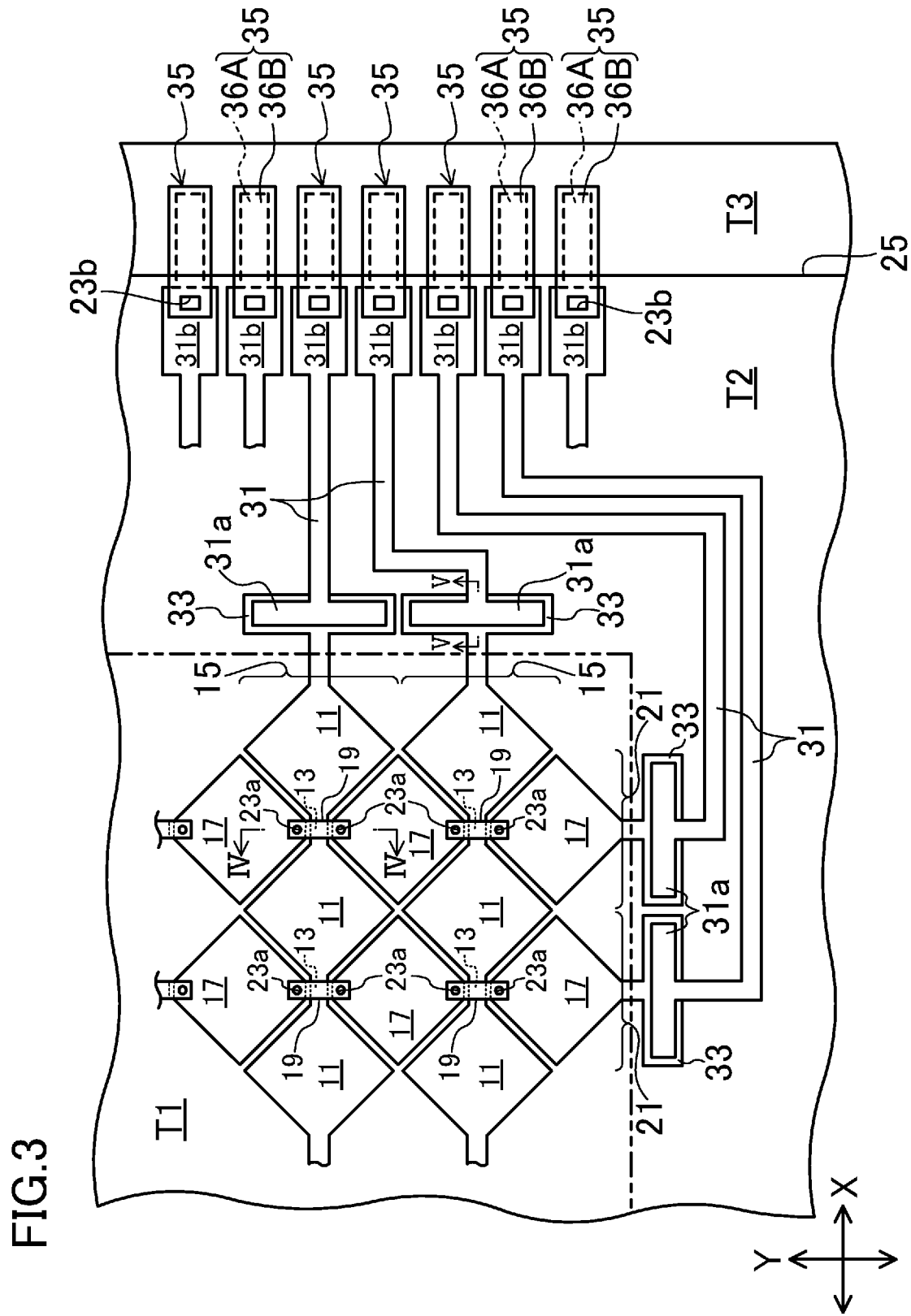
FIG. 3 is an enlarged top view illustrating the connection between electrodes for touch position detection and external connecting terminals in the touch panel according to the first embodiment.
Figure 4:
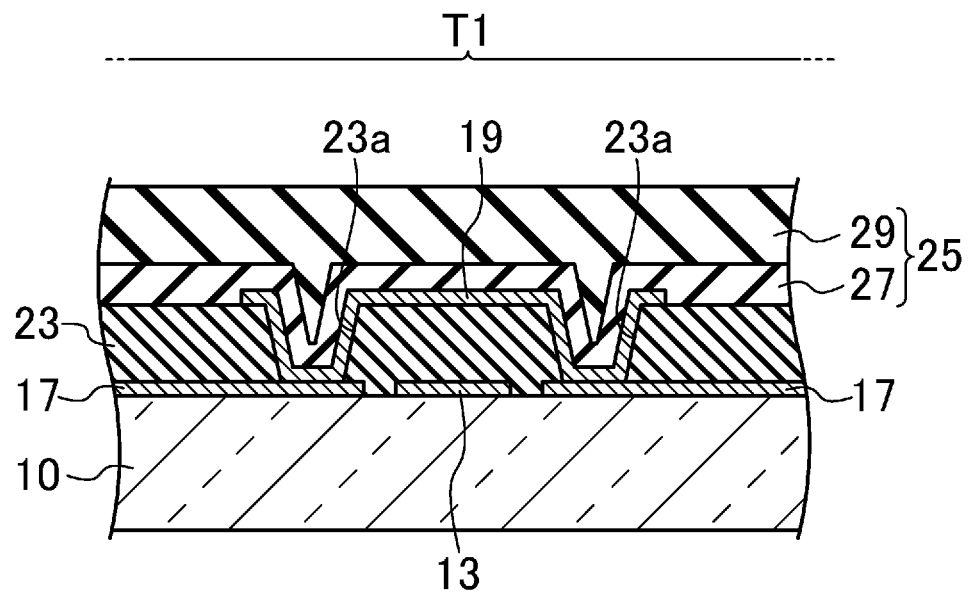
FIG. 4 is a cross-sectional view illustrating the cross-sectional structure taken along the line IV-IV of FIG. 3.
Figure 5:
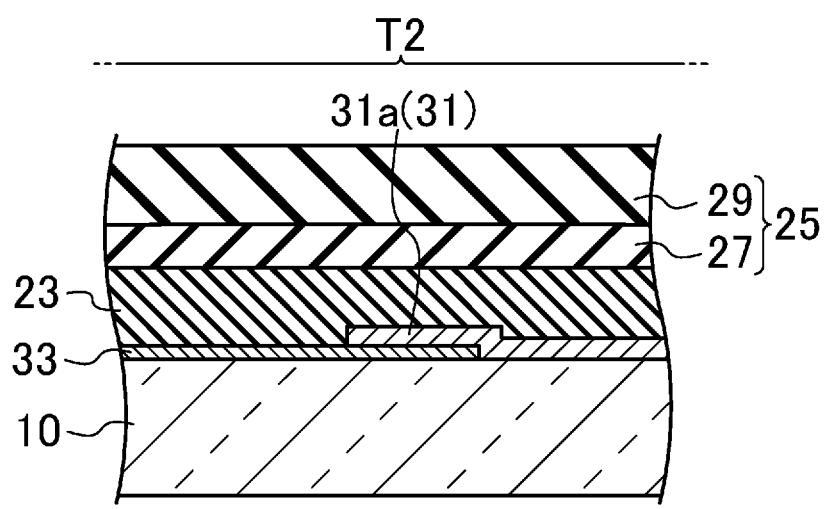
FIG. 5 is a cross-sectional view illustrating the cross-sectional structure taken along the line V-V of FIG. 3.
Figure 6:
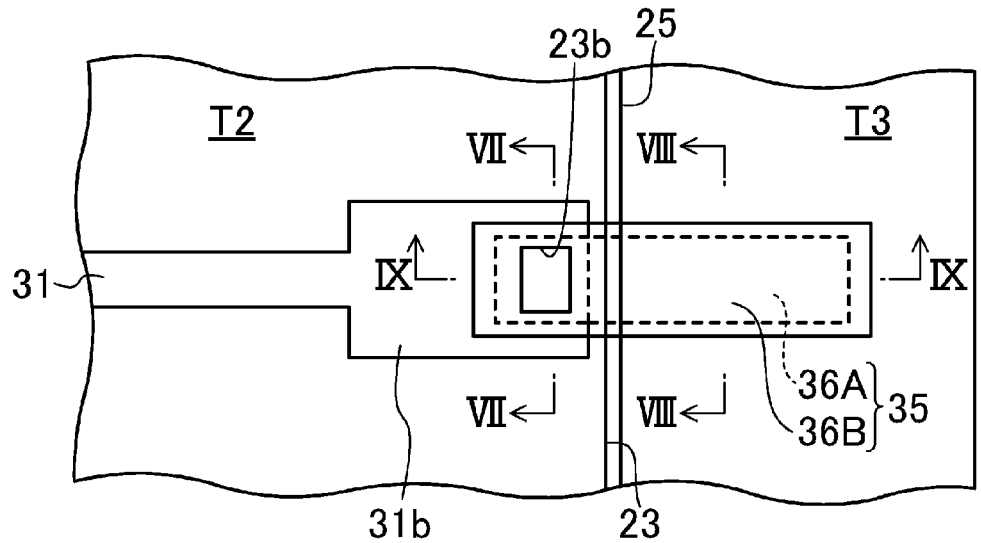
FIG. 6 is an enlarged top view illustrating the connection between an external connecting terminal and a lead line in the touch panel according to the first embodiment.
Figure 7:
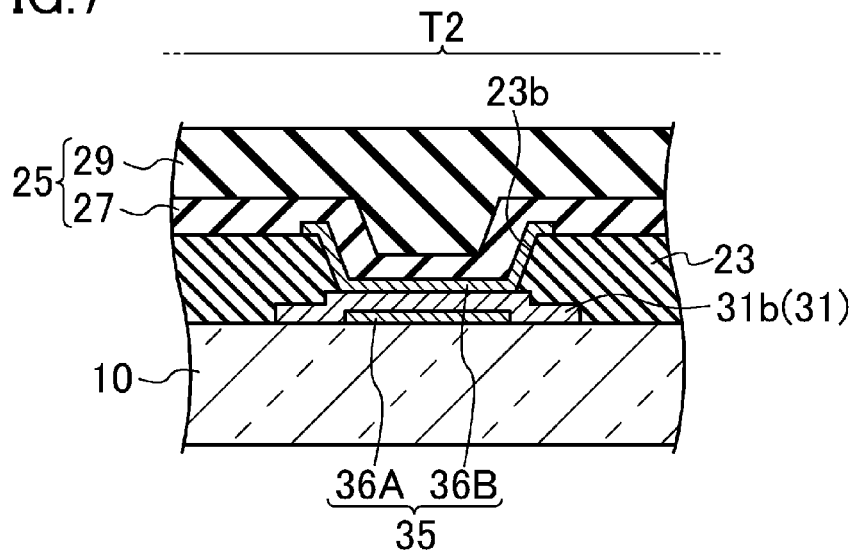
FIG. 7 is a cross-sectional view illustrating the cross-sectional structure taken along the line VII-VII of FIG. 6.
Figure 8:
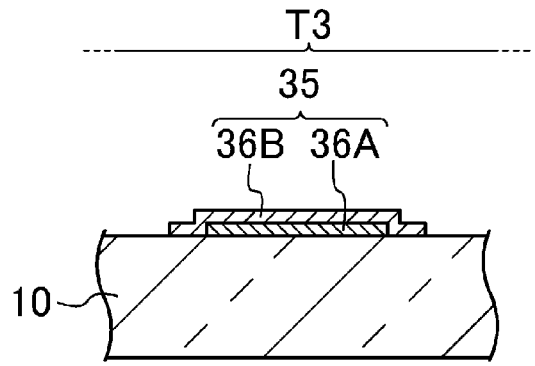
FIG. 8 is a cross-sectional view illustrating the cross-sectional structure taken along the line VIII-VIII of FIG. 6.
Figure 9:
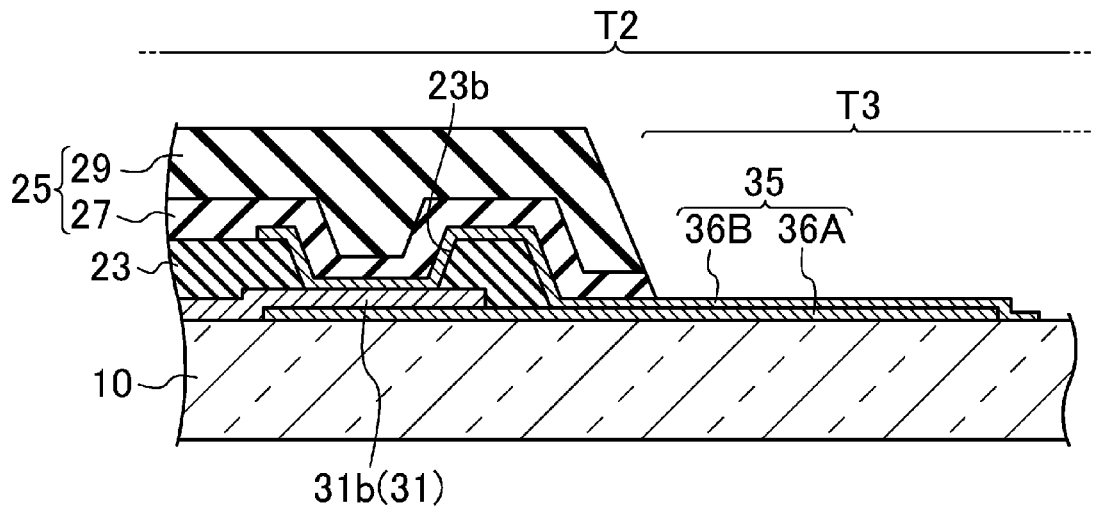
FIG. 9 is a cross-sectional view illustrating the cross-sectional structure taken along the line IX-IX of FIG. 6.

FIGS. 2-9 illustrate the structure of the touch panel TP. FIG. 2 is a schematic top view of the touch panel TP. FIG. 3 is an enlarged top view illustrating the connection between the electrodes 11 and 17 for touch position detection and external connecting terminals 35 in the touch panel TP. FIGS. 4 and 5 are cross-sectional views illustrating the cross-sectional structure taken along the lines IV-IV and V-V of FIG. 3, respectively. FIG. 6 is an enlarged top view illustrating the connection between each external connecting terminal 35 and a lead line 31 in the touch panel TP. FIGS. 7, 8, and 9 are cross-sectional views illustrating the cross-sectional structure taken along the lines VII-VII, VIII-VIII, and IX-IX of FIG. 6, respectively.

The touch panel TP according to this embodiment is directly formed on the outer surface of the counter substrate 3 forming the liquid crystal display panel DP to form the liquid crystal display device S with the touch panel thin as a whole. The touch panel TP is a projected capacitive touch panel; and includes, as shown in FIG. 2, for example, a rectangular touch region T1 for detecting a touch position touched by a contact body (e.g., a finger of a user); for example, a rectangular picture-frame region T2 surrounding the touch region T1 and not capable of detecting the touch position; and a terminal region T3 provided at one side of the picture-frame region T2 (on the right in FIG. 2) along the edge of the counter substrate 3. The touch region T1 is located in a region corresponding to the display region D of the liquid crystal display panel DP, and the picture-frame region T2 is located in the region corresponding to a non-display region.

The touch panel TP includes the electrodes 11 and 17 for touch position detection located in the touch region T1, the plurality of lead lines 31 electrically connected to the electrodes 11 and 17 for touch position detection, and drawn from the touch region T1 to the terminal region T3 in the picture-frame region T2, the external connecting terminals 35 provided at the portions to which the lead lines 31 are drawn and arranged in the terminal region T3, and a controller 41 which is an external circuit electrically connected to the external connecting terminals 35.

Structures of Electrodes 11 and 17 for Touch Position Detection

The electrodes 11 and 17 for touch position detection are a plurality of first electrodes 11 (outline electrodes in FIG. 2) arranged in a matrix, and a plurality of second electrodes 17 (shadow electrodes in FIG. 2) also arranged in a matrix. The first electrodes 11 and the second electrodes 17 alternately arranged in an oblique direction in FIG. 2 to form a honeycomb as a whole.

The first electrodes 11 are formed in, for example, a substantial rectangular shape, and arranged at predetermined intervals so that their corners face in the horizontal direction (i.e., the X-axis direction) and the vertical direction (i.e., the Y-axis direction) in FIG. 2. As shown in FIG. 3, adjacent pairs of the plurality of first electrodes 11 aligned in the X-axis direction are connected by the first connecting portions 13 and integrally formed, thereby forming each first electrode group 15. That is, the first electrodes 11 and the first connecting portions 13 are alternately arranged in the X-axis direction. The plurality of first electrode groups 15, each of which is a line of the first electrodes 11 integrally formed with the first connecting portions 13 interposed therebetween, are arranged in parallel in the Y-axis direction. The first electrodes 11 and the first connecting portions 13 are made of ITO, IZO, etc.

The second electrodes 17 are also formed in, for example, a substantial rectangular shape, and arranged at predetermined intervals so that their corners face in the X-axis direction and the Y-axis direction. Adjacent pairs of the plurality of second electrodes 17 aligned in the Y-axis direction are connected and electrically coupled by the second connecting portions 19, thereby forming each second electrode group 21. That is, the second electrodes 17 and the second connecting portions 19 are alternately arranged in the Y-axis direction. The plurality of second electrode groups 21, each of which is a line of the second electrodes 17 electrically connected via the second connecting portions 19, are arranged in parallel in the X-axis direction. The second electrodes 17 and the second connecting portions 19 are made of ITO, IZO, etc.

As shown in FIG. 4, the first electrode groups 15 (i.e., the first electrodes 11), the first connecting portions 13, and the second electrode groups 21 (i.e., the second electrodes 17) are formed on the outer surface of the insulating substrate 10 forming the counter substrate 3, and covered by an interlayer insulating film 23.

On the other hand, the second connecting portions 19 are provided on the interlayer insulating film 23, and covered by a protection insulating film 25 provided on the interlayer insulating film 23 as well. The second connecting portions 19 form a cross-linked structure extending over the first connecting portions 13 with the interlayer insulating film 23 interposed therebetween, and the both ends of the second connecting portions 19 are connected to the corners of the second electrodes 17 via contact holes 23a formed in the interlayer insulating film 23.

As such, in this embodiment, the first electrode groups 15 and the second electrode groups 21 are provided in the same layer, thereby causing a change in the capacitance generated between a contact body such as a finger and the first and second electrodes 11 and 17 in the touch position to the same extent. This reduces the difference in the sensitivity of the change in the capacitance between the first electrodes 11 and the second electrodes 17, thereby enabling highly sensitive detection of the touch position.

In this embodiment, the first electrode groups 15 (i.e., the first electrodes 11), the first connecting portions 13, and the second electrode groups 21 (i.e., the second electrodes 17) form the first conductive pattern for touch position detection of the present disclosure. The second connecting portions 19 form the second conductive pattern for touch position detection of the present disclosure.

The protection insulating film 25 is formed by stacking a first protection insulating film 27 made of silicon nitride (SiN) etc., and a second protection insulating film 29 made of an acrylic-based organic insulating material; and covers the interlayer insulating film 23. The interlayer insulating film 23 and the protection insulating film 25 are not formed in the terminal region T3 to expose the external connecting terminals 35 to the outside.

Structure of Lead Line 31

As shown in FIG. 3, each lead line 31 extends from the periphery of the touch region T1 to the position short of the terminal region T3. The lead line 31 is covered by the interlayer insulating film 23 and the protection insulating film 25, and the entire lead line 31 is located at the inner side of the outer edges of both the insulating films 23 and 25 as shown in FIG. 6. Then, the two insulating films of the interlayer insulating film 23 and the protection insulating film 25 block moisture etc. entering from the outside to the lead line 31, thereby greatly preventing corrosion of the lead line 31.

The lead line 31 is formed by sequentially stacking, for example, a molybdenum-niobium (MoNb) alloy layer, an aluminum (Al) layer, and a molybdenum-niobium (MoNb) alloy layer; a molybdenum nitride (MoN) layer, an aluminum (Al) layer, and a molybdenum nitride (MoN) layer; or a molybdenum (Mo) layer, an aluminum (Al) layer, and a molybdenum (Mo) layer.

A lead base end 31a of each lead line 31 is connected to an internal connecting terminal 33, which is connected to one of the first electrode groups 15 or the second electrode groups 21. On the other hand, a lead top 31b of each lead line 31 is connected to one of the external connecting terminals 35.

As shown in FIG. 3, numbers of internal connecting terminals 33 are aligned along the periphery of the touch region T1. Each internal connecting terminal 33 is integrally formed with the one of the first electrodes 11, which is located at one end of the corresponding first electrode group 15, or the one of the second electrodes 17, which is located at one end of the corresponding second electrode group 21. The internal connecting terminal 33 is provided under one of the lead lines 31, and connected to the lower surface of the lead line 31 as shown in FIG. 5.

As shown in FIG. 3, numbers of external connecting terminals 35 are drawn out of the interlayer insulating film 23 and the protection insulating film 25, and densely aligned in the terminal region T3. As shown in FIGS. 6-9, each external connecting terminal 35 includes a first interconnect layer 36A and a second interconnect layer 36B, and as a parallel connection structure, in which the first interconnect layer 36A and the second interconnect layer 36B are connected in parallel to one of the lead lines 31.

The first interconnect layer 36A is provided under the lead line 31, is connected to the lower surface of the lead line 31, and extends from the region with the interlayer insulating film 23 and the protection insulating film 25 to the terminal region T3 outside the region. On the other hand, the second interconnect layer 36B is provided on the interlayer insulating film 23 at the portion overlapping the lead line 31, and is connected to the upper surface of the lead line 31 via a contact hole 23b, which is formed in the interlayer insulating film 23, at the portion overlapping the first interconnect layer 36A. This second interconnect layer 36B also extends from the region with the interlayer insulating film 23 and the protection insulating film 25 to the terminal region T3 outside the region. As shown in FIGS. 8 and 9, the external connecting terminal 35 is formed in the terminal region T3 by stacking the first interconnect layer 36A and the second interconnect layer 36B.

This parallel connection structure greatly reduces the electrical resistance of the external connecting terminal 35. Specifically, since the external connecting terminal 35 includes the first interconnect layer 36A and the second interconnect layer 36B, which are connected in parallel to the lead line 31, the electrical resistance is the sum of the inverse of the electrical resistance value of the first interconnect layer 36A and the inverse of the electrical resistance value of the second interconnect layer 36B. This reduces the electrical resistance of the external connecting terminal 35 as compared to the case where the external connecting terminal 35 is a single layer made of transparent conductive oxide such as ITO and IZO and connected in series to the lead line 31.

In addition, each external connecting terminal 35 has the multilayer structure formed by stacking the first interconnect layer 36A and the second interconnect layer 36B in the terminal region T3. In this multilayer portion, the external connecting terminal is thick as compared to the case where the external connecting terminal 35 is a single layer made of transparent conductive oxide such as ITO and IZO, since the portion has one layer more to form the external connecting terminal 35, thereby greatly preventing the electrical resistance.

Although will be described later in detail, the first interconnect layer 36A is formed of the same film as the first electrode groups 15 (i.e., the first electrodes 11), the first connecting portions 13, the second electrode groups 21 (i.e., the second electrodes 17), and the internal connecting terminal 33. The second interconnect layer 36B is formed of the same film as the second connecting portions 19.

Structure of Controller 41

The controller 41 is mounted as a driver integrated circuit in the terminal region T3, for example, by a technique called "tape automated bonding (TAB)." The controller 41 includes, as a detection circuit 43, a capacitance detection circuit detecting a change in the capacitance generated between a contact body and ones of the first electrodes 11 and the second electrodes 17 in a touch position when the touch region T1 is touched by the contact body, or an impedance detection circuit detecting a change in the impedance generated by touch in the ones of the first electrodes 11 and the second electrodes 17 in the touch position. The controller 41 compares signals from the external connecting terminals 35 detected by the detection circuit 43, thereby detecting the touch position of the contact body in the touch region T1 and the movement of the touch position.

Manufacturing Method

An example method of manufacturing the touch panel TP and the liquid crystal display device DP will be described below with reference to FIG. 10. In this embodiment, an example has been described where the method is single wafer processing, in which the single TFT substrate 1 and the single counter substrate 3 are prepared, and the both substrates 1 and 3 are bonded together to manufacture a single liquid crystal display panel DP. Instead, multiple wafer processing is also applicable, in which a mother panel including a plurality of cell units is prepared, and the mother panel is divided into the cell units to manufacture a plurality of liquid crystal display panels DP at the same time.

Figure 10:
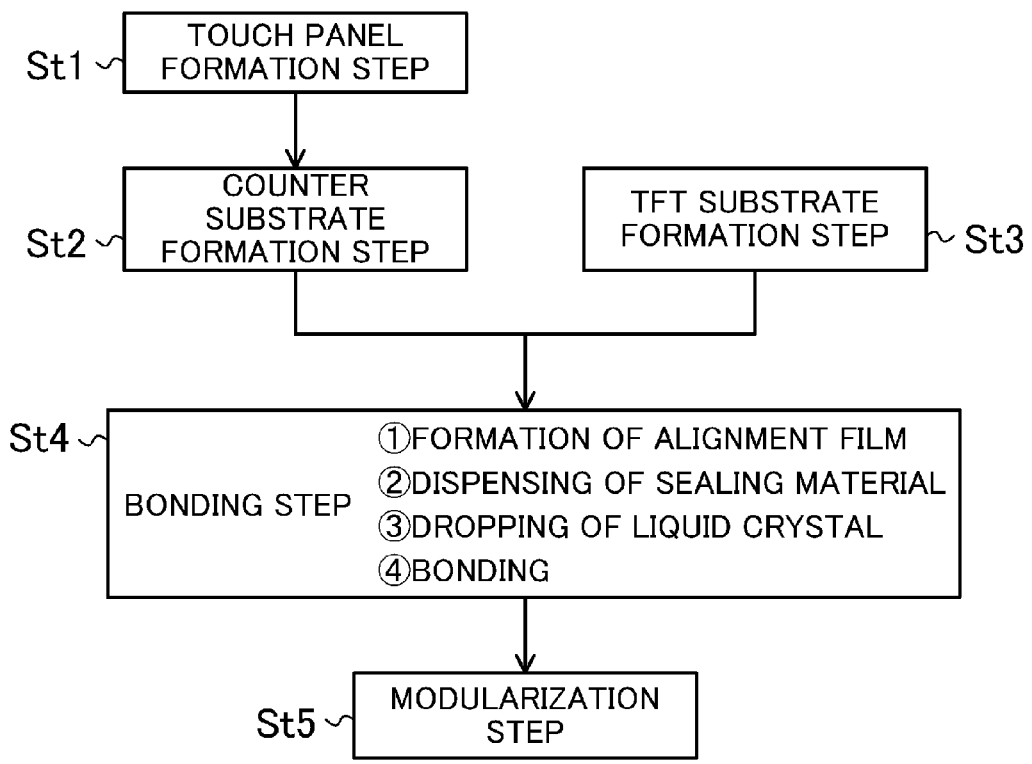
FIG. 10 is a flow chart illustrating a method of manufacturing the liquid crystal display device according to the first embodiment.

FIG. 10 is a flow chart illustrating the method of manufacturing the liquid crystal display device S. The method of manufacturing the liquid crystal display device S includes a touch panel formation step St1, a counter substrate formation step St2, a TFT substrate formation step St3, a bonding step St4, and a modularization step St5.

Touch Panel Formation Step St1

The first electrodes 11, the first connecting portions 13, the second electrodes 17, the internal connecting terminals 33, the lead lines 31, the interlayer insulating film 23, the second connecting portions 19, the external connecting terminals 35 (each including the first interconnect layer 36A and the second interconnect layer 36B), and the protection insulating film 25 are formed on the insulating substrate 10 such as a glass substrate, which has been prepared in advance, by repeating known photolithography to form the touch panel TP.

Counter Substrate Formation Step St2

The black matrix, the color filters, the common electrode, and the photo spacer are formed on the back surface of the substrate 10 of the touch panel TP by a known means of repeating photolithography to form the counter substrate 3 with the touch panel TP.

TFT Substrate Formation Step St3

The gate interconnects, the source interconnects, the TFTs, and the pixel electrodes are formed on an insulating substrate such as a glass substrate, which has been prepared in advance, by a known means of repeating photolithography to form the TFT substrate 1.

Bonding Step St4

Alignment films are formed on the surfaces of the TFT substrate 1 and the counter substrate 3 by printing, and then the surfaces are subjected to rubbing as necessary. Next, the sealing material 5 is dispensed in a frame form by a dispenser etc. A predetermined amount of a liquid crystal material is dropped to the inner region of the sealing material 5. Then, after the TFT substrate 1 and the counter substrate 3 are bonded together by the sealing material 5 and the liquid crystal material under reduced pressure to form the liquid crystal layer 7, the bond formed by the bonding is exposed under atmospheric pressure to apply pressure on the substrate of the bond. In this state, the sealing material 5 is cured by irradiation with an ultraviolet beam or heat treatment to bond the TFT substrate 1 and the counter substrate 3 together, thereby fabricating the liquid crystal display panel DP.

If there is a gap between the TFT substrate 1 and the counter substrate 3 outside the sealing material 5, the sealing material 5 fills the gap and is cured as necessary. After that, polarizing plates are bonded to the both surfaces of the bond, i.e., the outer surface of the TFT substrate 1 and the outer surface of the touch panel TP on the counter substrate 3.

Modularization Step St5

Integrated circuit chips and a circuit board are mounted on the terminal region T3 of the liquid crystal display panel DP with anisotropic conductive films etc., interposed therebetween. The controller 41 is mounted on the terminal region T3 of the touch panel TP. The back light unit BL is attached to the back surface of the liquid crystal display panel DP. As such, the liquid crystal display panel DP, the back light unit BL, and the touch panel TP are modularized.

By the above-described steps, the liquid crystal display device S with the touch panel TP shown in FIG. 1 is manufactured.

The liquid crystal display device S according to the present disclosure is characterized in the structure of the touch panel TP. The touch panel formation step St1 will be described below in detail with reference to FIGS. 11-15. The touch panel formation step St1 includes first to fifth patterning steps. FIGS. 11-15 sequentially show the first to fifth patterning steps of the touch panel formation step St1.

First Patterning Step

First, as shown in FIG. 11A, a transparent conductive film 51 made of, for example, ITO or IZO is formed on the insulating substrate 10 by sputtering. The transparent conductive film 51 is patterned using a first photomask, thereby forming, as shown in FIG. 11B, the first electrodes 11, the first connecting portions 13, the second electrodes 17, the internal connecting terminals 33, and the first interconnect layers 36A to form the first electrode groups 15 and the second electrode groups 21.

Second Patterning Step

For example, a molybdenum-niobium (MoNb) alloy film, an aluminum (Al) film, and a molybdenum-niobium (MoNb) alloy film; a molybdenum nitride (MoN) film, an aluminum (Al) film, and a molybdenum nitride (MoN) film; or a molybdenum (Mo) film, an aluminum (Al) film, and a molybdenum (Mo) film are sequentially formed on the substrate provided with the first electrode groups 15 (i.e., the first electrodes 11), the first connecting portions 13, the second electrode groups 21 (i.e., the second electrodes 17), the internal connecting terminals 33, and the first interconnect layers 36A by sputtering to cover these elements, thereby forming a metal multilayer film 53 shown in FIG. 12A. Then, the metal multilayer film 53 is patterned using a second photomask to form each lead line 31 so that one end overlaps and is connected to the first interconnect layers 36A as shown in FIG. 12B, and so that the other end overlaps and is connected to the corresponding internal connecting terminal 33.

Third Patterning Step

An insulating film 54 shown in FIG. 13A and made of, for example, silicon nitride (SiN) is formed on the substrate provided with the lead lines 31 by chemical vapor deposition (hereinafter referred to as CVD) to cover the first electrode groups 15 (i.e., the first electrodes 11), the first connecting portions 13, the second electrode groups 21 (i.e., the second electrodes 17), the internal connecting terminals 33, the first interconnect layers 36A, and the lead lines 31. Next, the insulating film 54 is patterned using a third photomask to form the contact holes 23a and 23b in the insulating film 54 as shown in FIG. 13B so that the corners of the second electrodes 17 and the lead tops 31b of the lead lines 31 are partially exposed, and the portion of the insulating film in the terminal region T3 is removed to expose the first interconnect layers 36A from the insulating film 54. As such, the interlayer insulating film 23 is formed from the insulating film 54.

Fourth Patterning Step

As shown in FIG. 14A, a transparent conductive film 55 made of, for example, ITO or IZO is formed on the substrate provided with the interlayer insulating film 23 by sputtering. The transparent conductive film 55 is patterned using a fourth photomask to form, as shown in FIG. 14B, the second connecting portions 19 to be connected to the second electrodes 17 via the contact holes 23a, and the second interconnect layers 36B to be connected to the lead lines 31 via the contact holes 23b and to cover the first interconnect layers 36A in the terminal region T3, thereby forming the external connecting terminals 35.

Fifth Patterning Step

A first insulating film 57 made of, for example, silicon nitride (SiN) is formed on the substrate provided with the second connecting portions 19 and the second interconnect layers 36B by CVD to cover the second connecting portions 19 and the second interconnect layers 36B. Then, as shown in FIG. 15A, a second insulating film 58 made of an acrylic-based organic insulating material is formed on the first insulating film 57 by spin coating or slit coating to form a multilayer insulating film 59. As shown in FIG. 15B, the protection insulating film 25 is patterned using a fifth photomask to remove the portion of the multilayer insulating film in the terminal region T3 to expose the external connecting terminals 35 from the multilayer insulating film 59, thereby forming the protection insulating film 25 from the multilayer insulating film 59.

While in this fifth patterning step, the first protection insulating film 27 and the second protection insulating film 29 are patterned together, the second protection insulating film 29 may be formed by photolithography using a fifth photomask and then patterned by etching the first protection insulating film 27 using the second protection insulating film 29 as a mask.

As described above, the touch panel TP is formed.

Advantages of First Embodiment

In this first embodiment, each external connecting terminal 35 has the parallel connection structure of the first interconnect layer 36A and the second interconnect layer 36B, which are connected in parallel to the lead line 31, and has the multilayer formed by stacking the first interconnect layer 36A and the second interconnect layer 36B in the terminal region T3, thereby greatly reducing the electrical resistance of the external connecting terminal 35 as compared to the case where the external connecting terminal 35 is a single layer made of transparent conductive oxide such as ITO and IZO and connected in series to the lead line 31.

Since the first interconnect layer 36A is formed of the same film as the first electrodes 11, the second electrodes 17, etc., and the second interconnect layer 36B is formed of the same film as the second connecting portions 19; there is no need to increase the manufacturing steps so that each external connecting terminal 35 has the parallel connection structure.

This reduces the electrical resistance of the external connecting terminals 35 without increasing the manufacturing costs. This prevents poor conduction between the controller 41 and the first and second electrode groups 15 and 21, thereby providing an excellent function of touch position detection. As a result, the liquid crystal display device S, which accurately inputs information by performing various types of operation using a contact body such as a finger or a pen, is provided at low costs.

First Variation of First Embodiment

Figure 16:
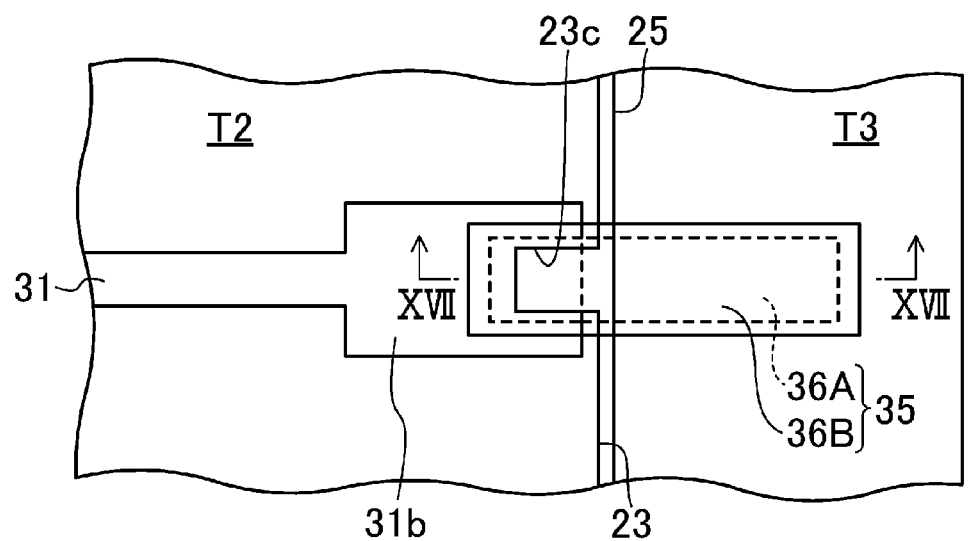
FIG. 16 is an enlarged top view illustrating the connection between an external connecting terminal and a lead line in a touch panel according to a first variation of the first embodiment.
Figure 17:
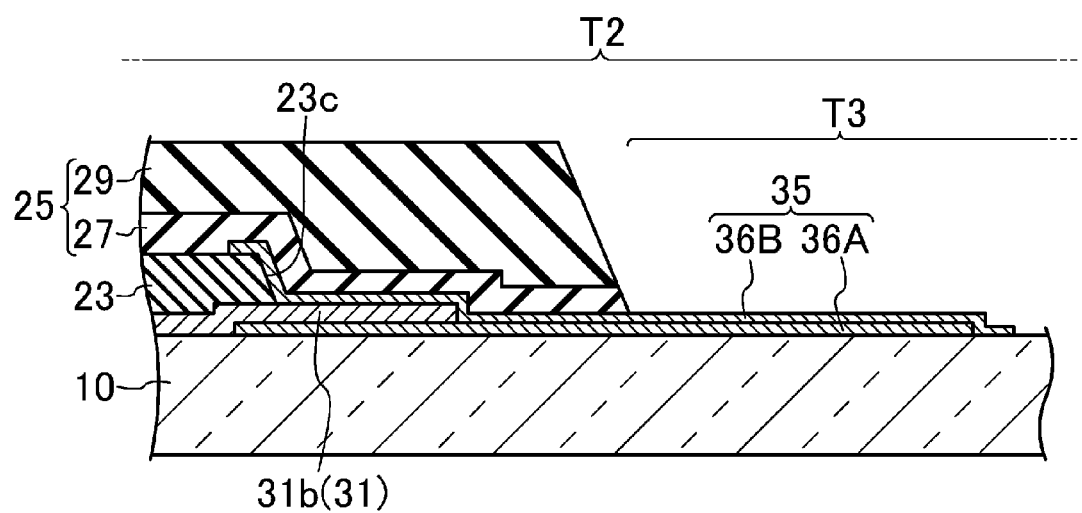
FIG. 17 is a cross-sectional view illustrating the cross-sectional structure taken along the line XVII-XVII of FIG. 16.

FIG. 16 is an enlarged top view illustrating the connection between each external connecting terminal 35 and a lead line 31 in a touch panel TP according to a first variation. FIG. 17 is a cross-sectional view illustrating the cross-sectional structure taken along the line XVII-XVII of FIG. 16.

In the above-described first embodiment, the second interconnect layer 36B of each external connecting terminal 35 is connected to the corresponding lead line 31 via the contact hole 23b formed in the interlayer insulating film 23. In this variation, for example, a rectangular cutout portion 23c, which is open outside the outer edge of an interlayer insulating film 23, is formed in the interlayer insulating film 23 instead of the contact hole 23b, and a second interconnect layer 36B is connected to the lead line 31 via the cutout portion 23c.

Advantages of First Variation of First Embodiment

In this first variation, as compared to the first embodiment where each second interconnect layer 36B is connected to the corresponding lead line 31 via the contact hole 23a formed in the interlayer insulating film 23, the contact area between the second interconnect layer 36B and the lead line 31 increases, since the cutout portion 23c is open outside the outer edge of the interlayer insulating film 23. This reduces the contact resistance between the second interconnect layer 36B and the lead line 31. As a result, poor conduction between the external connecting terminal 35 and the lead line 31 is greatly prevented.

Second Variation of First Embodiment

Figure 18:
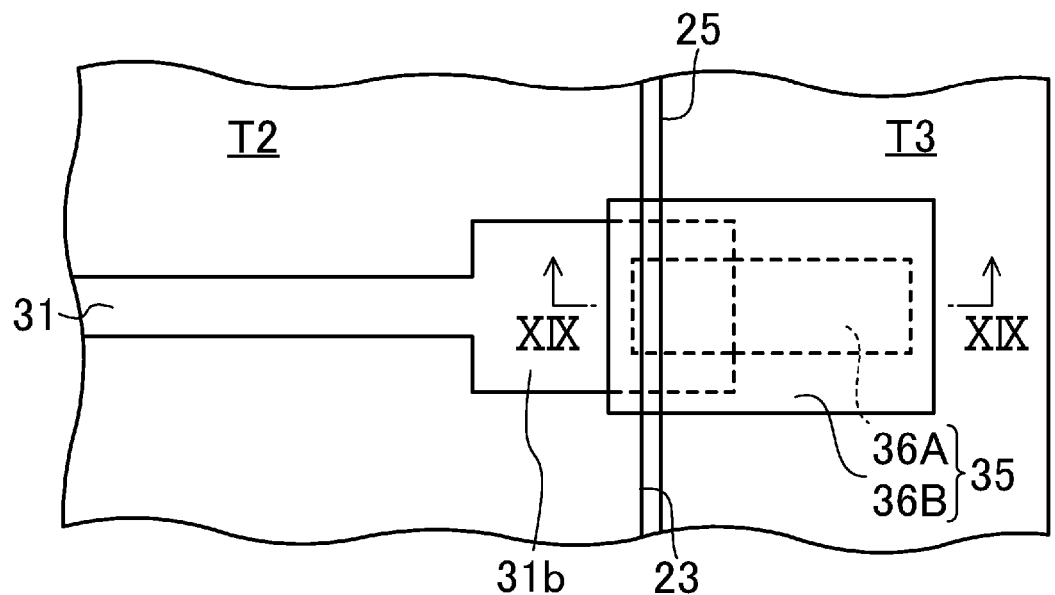
FIG. 18 is an enlarged top view illustrating the connection between an external connecting terminal and a lead line in a touch panel according to a second variation of the first embodiment.
Figure 19:
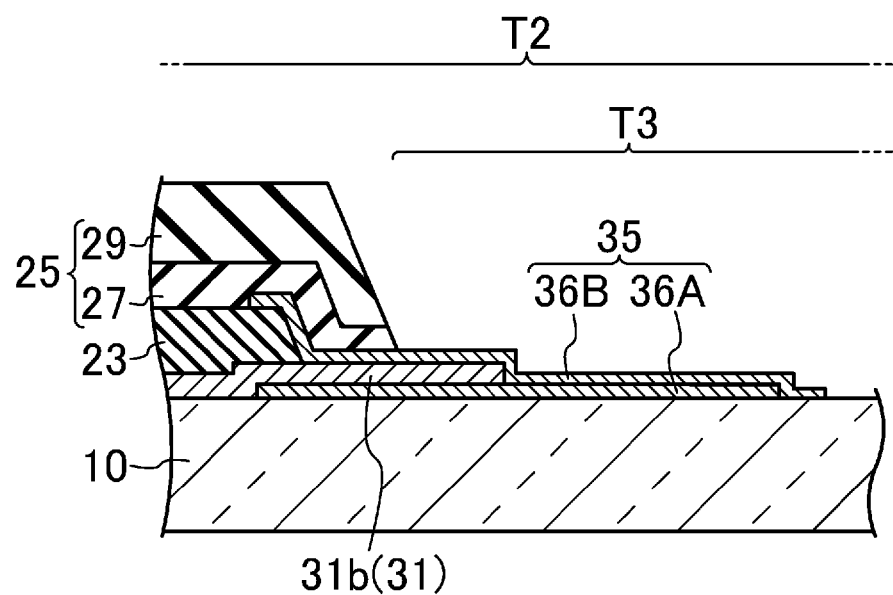
FIG. 19 is a cross-sectional view illustrating the cross-sectional structure taken along the line XIX-XIX of FIG. 18.

FIG. 18 is an enlarged top view illustrating the connection between each external connecting terminal 35 and a lead line 31 in a touch panel TP according to a second variation. FIG. 19 is a cross-sectional view illustrating the cross-sectional structure taken along the line XIX-XIX of FIG. 18.

In the above-described first embodiment, the entire lead lines 31 are located inside the interlayer insulating film 23. In this variation, a lead top 31b of each lead line 31 partially extends beyond an interlayer insulating film 23 and a protection insulating film 25 to a terminal region T3 located outside the interlayer insulating film 23 and the protection insulating film 25. A second interconnect layer 36B covers the entire extending portion of the lead line 31.

Advantages of Second Variation of First Embodiment

In this second variation, although being located outside the interlayer insulating film 23 and the protection insulating film 25, the extending portion of the lead line 31 is protected from moisture etc., by the second interconnect layer 36B covering the extending portion, and is less corroded. In this structure, in which the lead top 31b of the lead line 31 at least partially extends outside the insulating films 23 and 25, the width of the picture-frame region T2 at the terminal region T3 can be reduced as compared to the structure in which the entire lead line 31 is inside the insulating films 23 and 25.

Third Variation of First Embodiment

Figure 20:
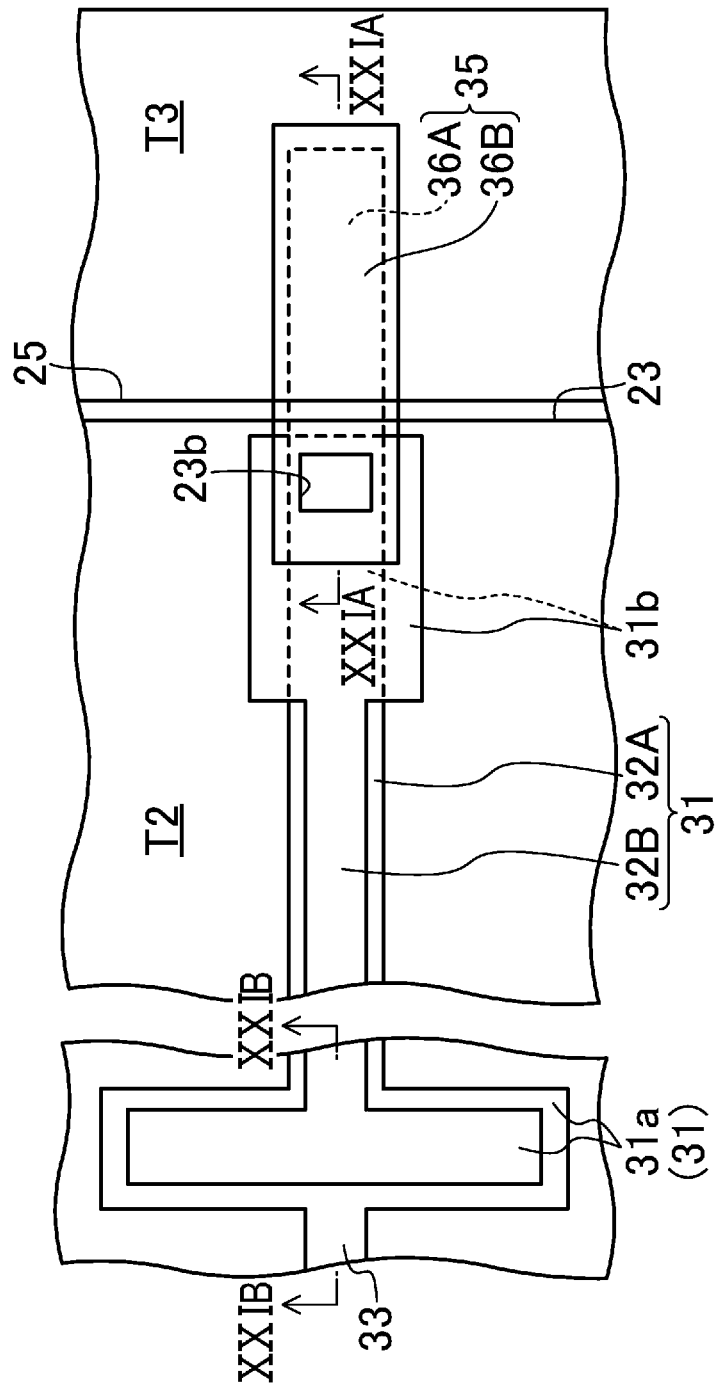
FIG. 20 is an enlarged top view illustrating the connection between a lead line and connecting terminals connected at its ends in a touch panel according to a third variation of the first embodiment.
Figure 21:
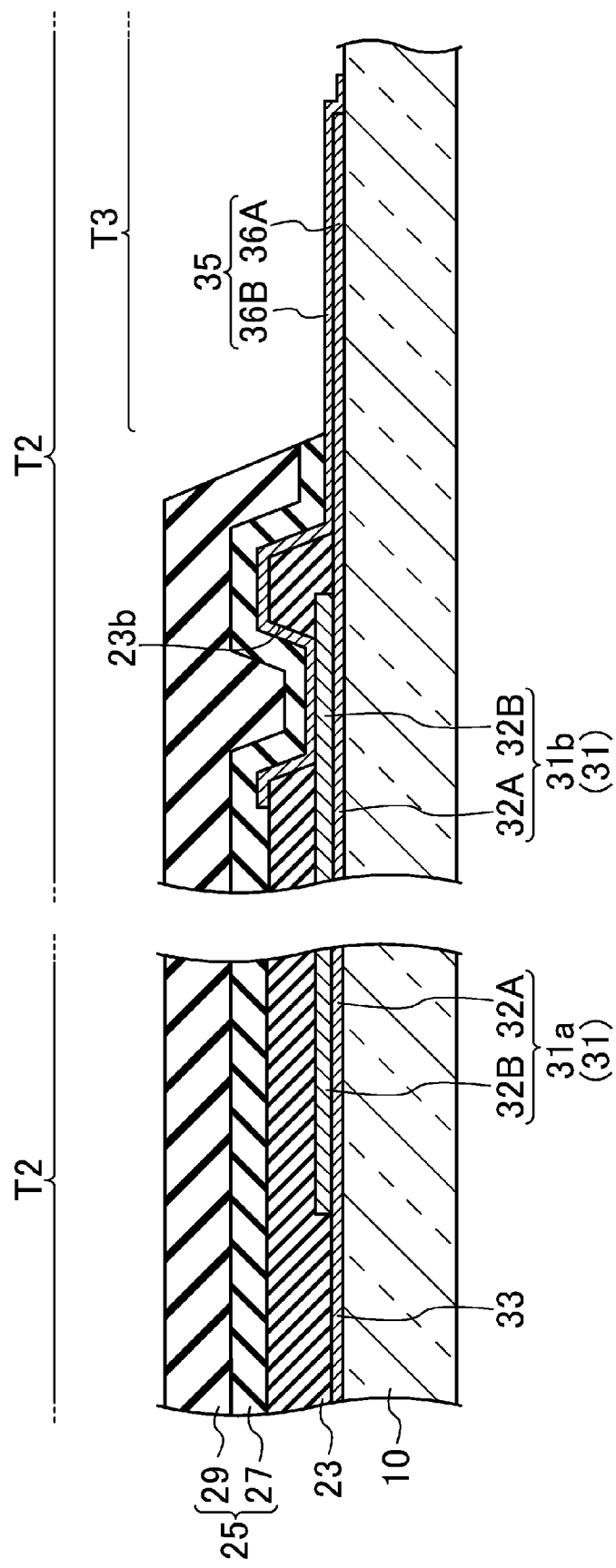
FIG. 21 is a cross-sectional view illustrating the cross-sectional structure taken along the line XXIA-XXIA of FIG. 20 on the right, and the cross-sectional structure taken along the line XXIB-XXIB of FIG. 20 on the left.

FIG. 20 is an enlarged top view illustrating the connection between each lead line 31 and connecting terminals 33 and 35 connected to the both ends of the lead line 31 in a touch panel TP according to a third variation. FIG. 21 is a cross-sectional view illustrating the cross-sectional structure taken along the line XXIA-XXIA of FIG. 20 on the right, and the cross-sectional structure taken along the line XXIB-XXIB of FIG. 20 on the left.

In the above-described first embodiment, each lead line 31 is formed by stacking the plurality of metal layers patterned together. In this variation, the lead line 31 is formed by stacking a lower interconnect layer 32A formed of the same film as first electrode groups 15 (i.e., first electrodes 11), first connecting portions 13, and second electrode groups 21 (i.e., second electrodes 17), and an upper interconnect layer 32B formed of a plurality of metal layers (e.g., MoNb/Al/MoNb, MoN/Al/MoN, Mo/Al/Mo) similar to those of the lead lines 31 in the first embodiment.

The lower interconnect layer 32A is integrally formed with the internal connecting terminal 33 and a first interconnect layer 36A to connect the internal connecting terminal 33 and the first interconnect layer 36A together. In this variation, the lower interconnect layer 32A is the first interconnect layer of the present disclosure, and the upper interconnect layer 32B is the second interconnect layer of the present disclosure.

Such a touch panel TP is manufactured by forming the lower interconnect layer 32A from a transparent conductive film 51 together with the first electrodes 11 and the second electrodes 17 in the first patterning step of the first embodiment, and by forming the upper interconnect layer 32B in the second patterning step.

Advantages of Third Variation of First Embodiment

In this third variation, the lead line 31 has the multilayer of the lower interconnect layer 32A and the upper interconnect layer 32B. Thus, as compared to the first embodiment where each lead line 31 is a layer made of only metal materials similar to those of the upper interconnect layer 32B, the lead line 31 is thick, since the multilayer has one layer (i.e., the lower interconnect layer 32A) more to form the lead line 31. This reduces the resistance of the lead line 31. As a result, poor conduction between the controller 41 and the first and second electrode groups 15 and 21 is more reliably prevented.

Formed of the same film as the first electrodes 11 and the second electrodes 17, the lower interconnect layer 32A can be formed together with the first electrodes 11 and the second electrodes 17 not to increase the manufacturing steps.

Fourth Variation of First Embodiment

Figure 22:
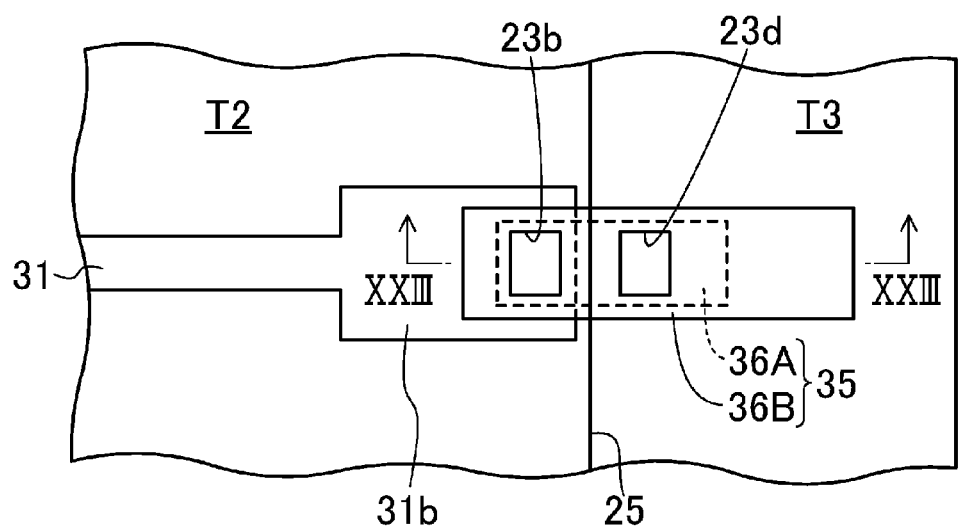
FIG. 22 is an enlarged top view illustrating the connection between an external connecting terminal and a lead line in a touch panel according to a fourth variation of the first embodiment.
Figure 23:
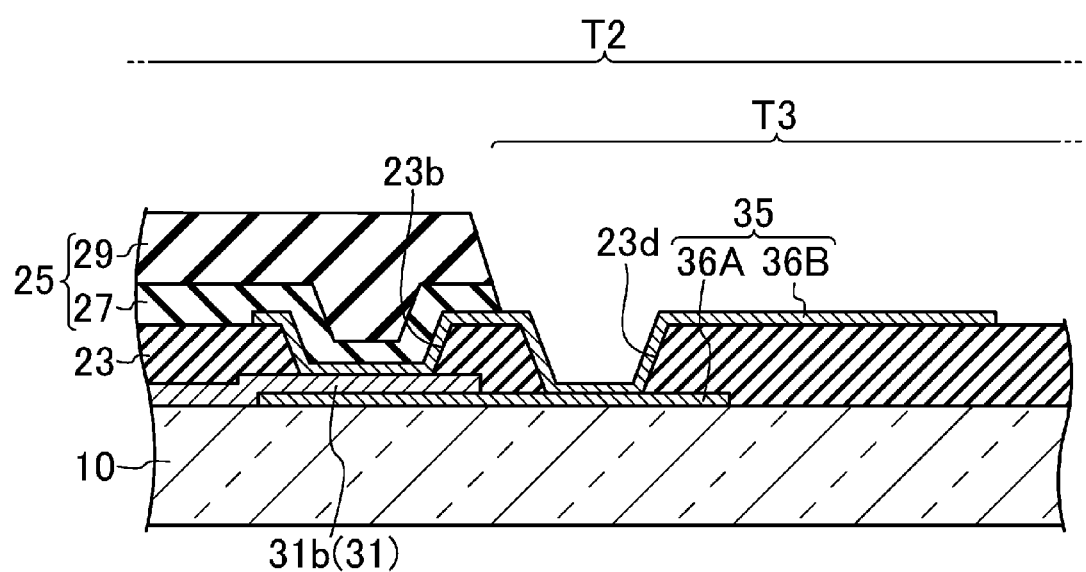
FIG. 23 is a cross-sectional view illustrating the cross-sectional structure taken along the line XXIII-XXIII of FIG. 22.

FIG. 22 is an enlarged top view illustrating the connection between each external connecting terminal 35 and a lead line 31 in a touch panel TP according to a fourth variation. FIG. 23 is a cross-sectional view illustrating the cross-sectional structure taken along the line XXIII-XXIII of FIG. 22.

In the above-described first embodiment, the interlayer insulating film 23 is not formed in the terminal region T3. In this variation, an interlayer insulating film 23 is also formed in a terminal region T3. In this variation as well, a protection insulating film 25 is not formed in the terminal region T3, and a first interconnect layer 36A and a second interconnect layer 36B extend beyond the protection insulating film 25 to the terminal region T3 located outside the protection insulating film 25. The second interconnect layer 36B is provided on the interlayer insulating film 23 in the terminal region T3, and is connected to the first interconnect layer 36A via a contact hole 23d formed in the interlayer insulating film 23.

Advantages of Fourth Variation of First Embodiment

In this fourth variation, since the external connecting terminal 35 has the parallel connection structure of the first interconnect layer 36A and the second interconnect layer 36B, which are connected in parallel to the lead line 31, the electrical resistance of the external connecting terminal 35 decreases without increasing the manufacturing costs, thereby providing an excellent function of touch position detection.

Fifth Variation of First Embodiment

Figure 24:
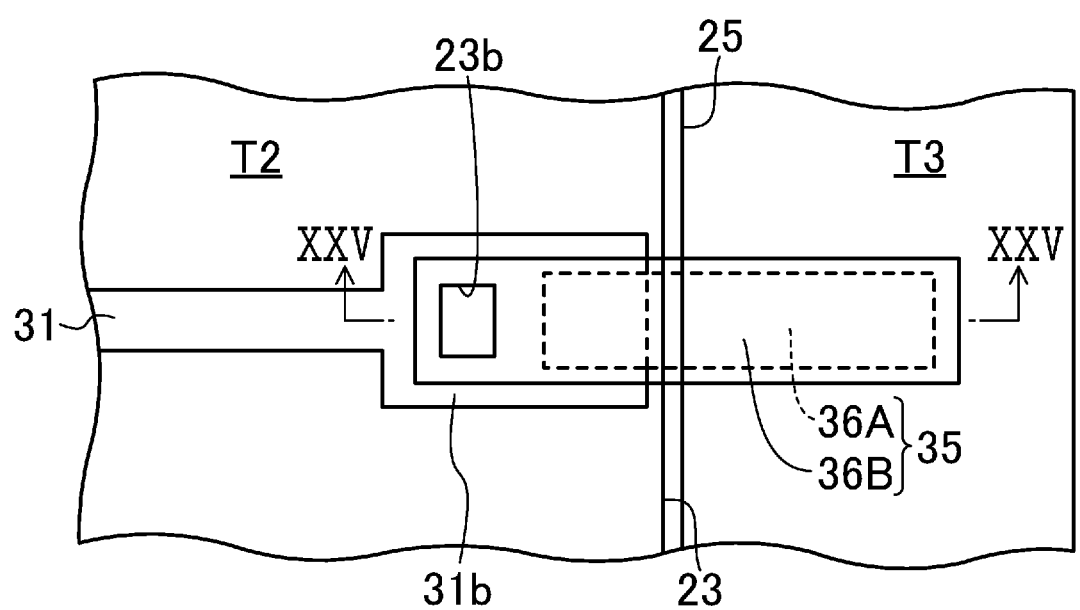
FIG. 24 is an enlarged top view illustrating the connection between an external connecting terminal and a lead line in a touch panel according to a fifth variation of the first embodiment.
Figure 25:
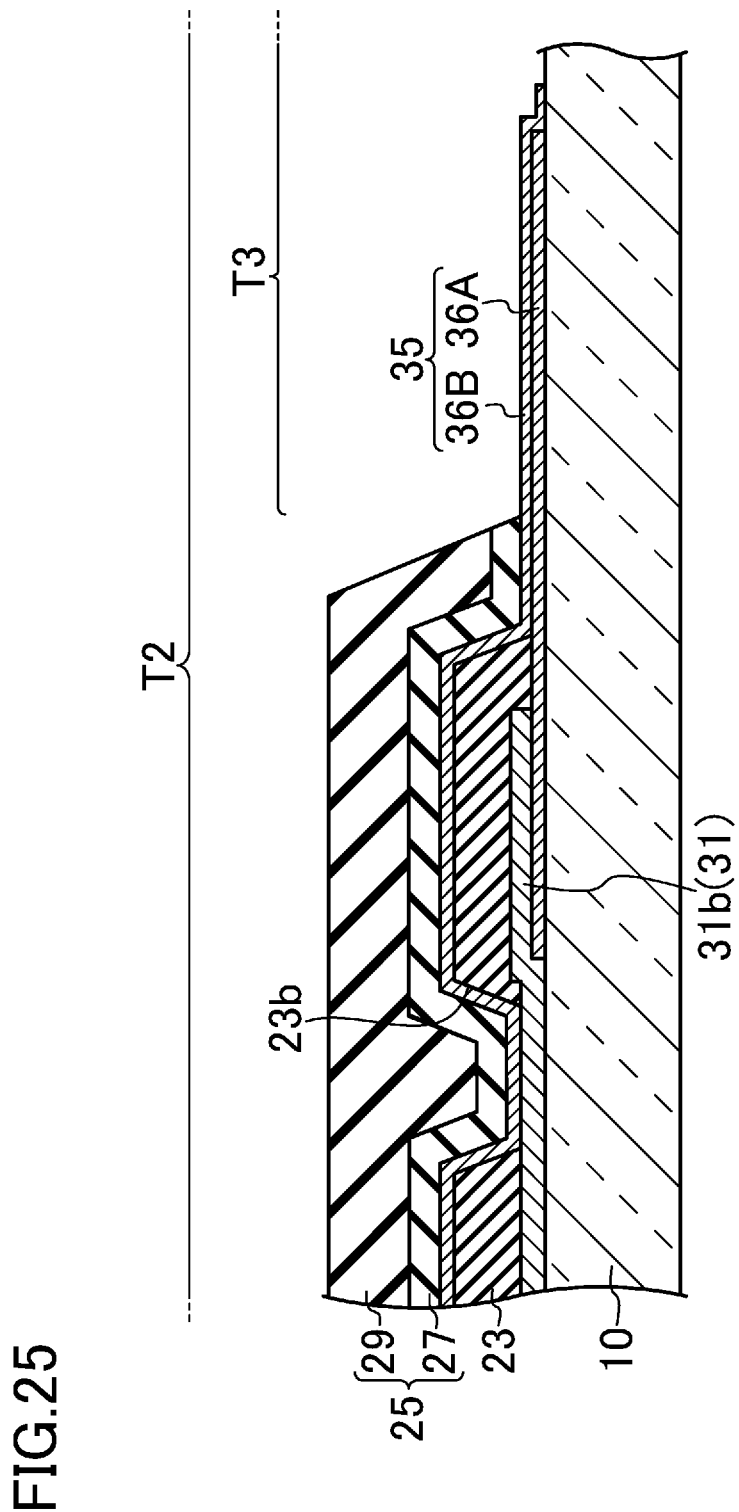
FIG. 25 is a cross-sectional view illustrating the cross-sectional structure taken along the line XXV-XXV of FIG. 24.

FIG. 24 is an enlarged top view illustrating the connection between each external connecting terminal 35 and a lead line 31 in a touch panel TP according to a fifth variation. FIG. 25 is a cross-sectional view illustrating the cross-sectional structure taken along the line XXV-XXV of FIG. 24.

In the above-described first embodiment, each second interconnect layer 36B is connected to the corresponding lead line 31 at the portion overlapping the first interconnect layer 36A. In this variation, a first interconnect layer 36A and a second interconnect layer 36B are electrically connected to the lead line 31 at different portions. Specifically, a contact hole 23b reaching a lead top 31b of the lead line 31 is formed at an inner portion of the interlayer insulating film 23 as compared to the first interconnect layer 36A (FIG. 24 and the left of FIG. 25), and the second interconnect layer 36B is connected to the lead line 31 via the contact hole 23b at the back of (in a position closer to the lead base than) as compared to the first interconnect layer 36A.

Such a touch panel TP is manufactured by forming the contact hole 23b to partially expose the lead top 31b of the lead line 31 at the portion overlapping the lead line 31 at inner portion of the interlayer insulating film 23 as compared to the first interconnect layer 36A in the third patterning step of the first embodiment, and by forming the second interconnect layer 36B to be connected to the lead line 31 via the contact hole 23b in the fourth patterning step.

Advantages of Fifth Variation of First Embodiment

In this fifth variation, the external connecting terminal 35 has the parallel connection structure of the first interconnect layer 36A and the second interconnect layer 36B, which are connected in parallel to the lead line 31. This reduces the electrical resistance of the external connecting terminal 35 without increasing the manufacturing costs, thereby providing an excellent function of touch position detection.

Second Embodiment of Invention

Figure 26:
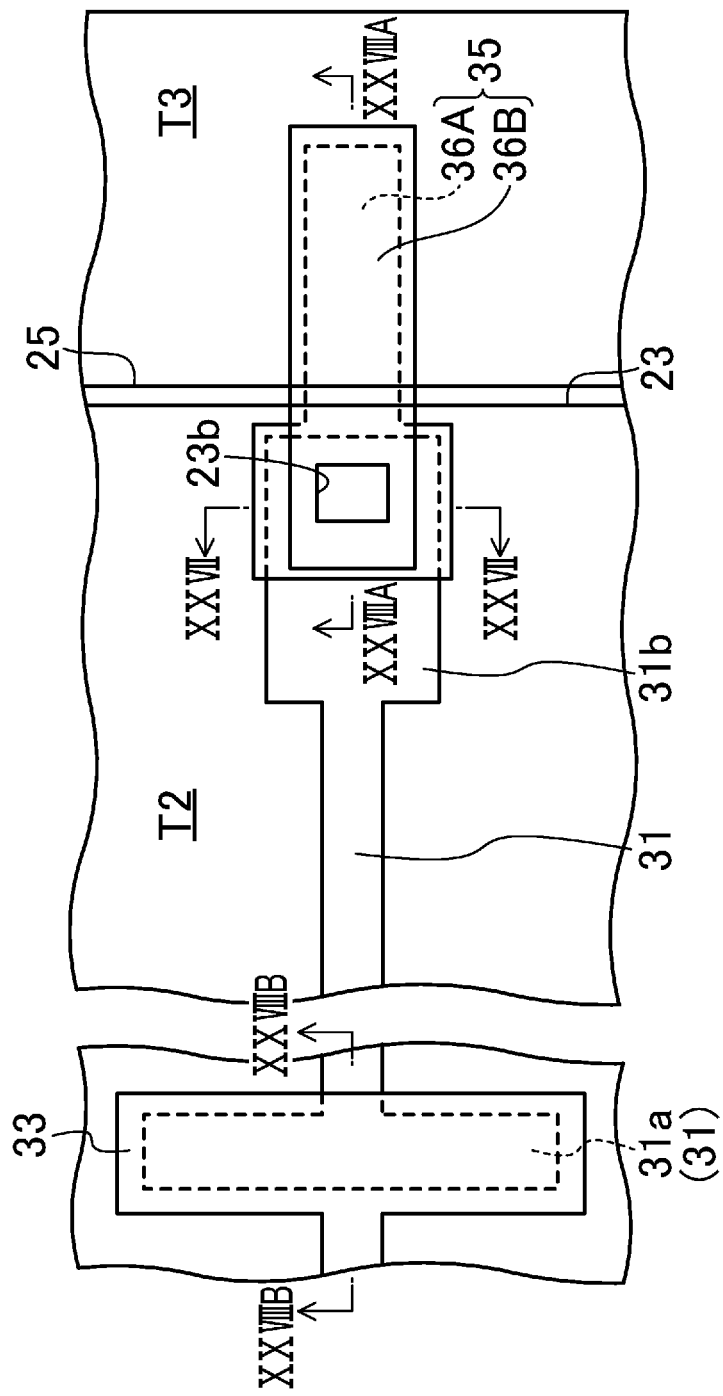
FIG. 26 is an enlarged top view illustrating the connection between an external connecting terminal and a lead line according to the touch panel according to the second embodiment.
Figure 27:
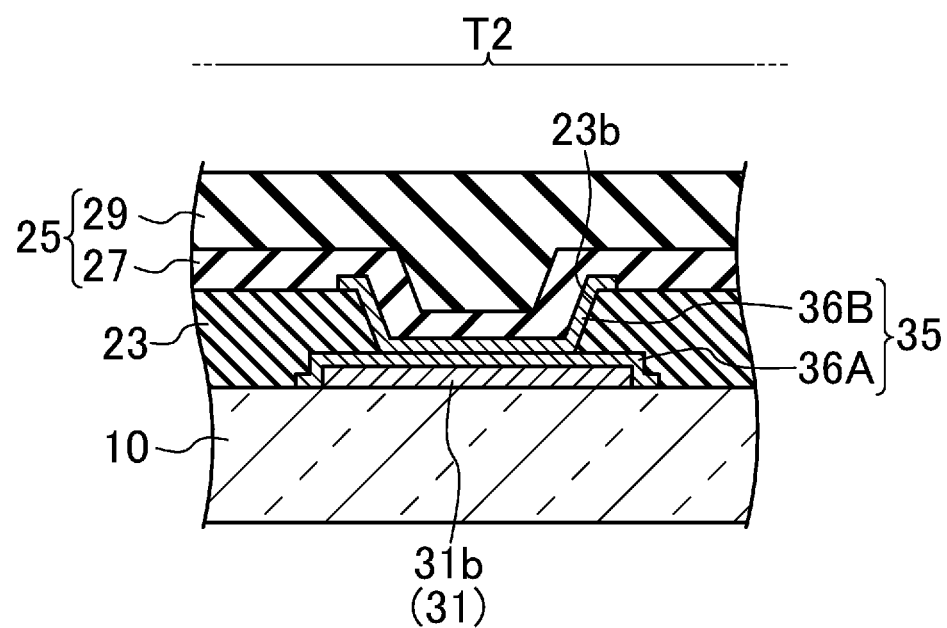
FIG. 27 is a cross-sectional view illustrating the cross-sectional structure taken along the line XXVII-XXVII of FIG. 26.
Figure 28:
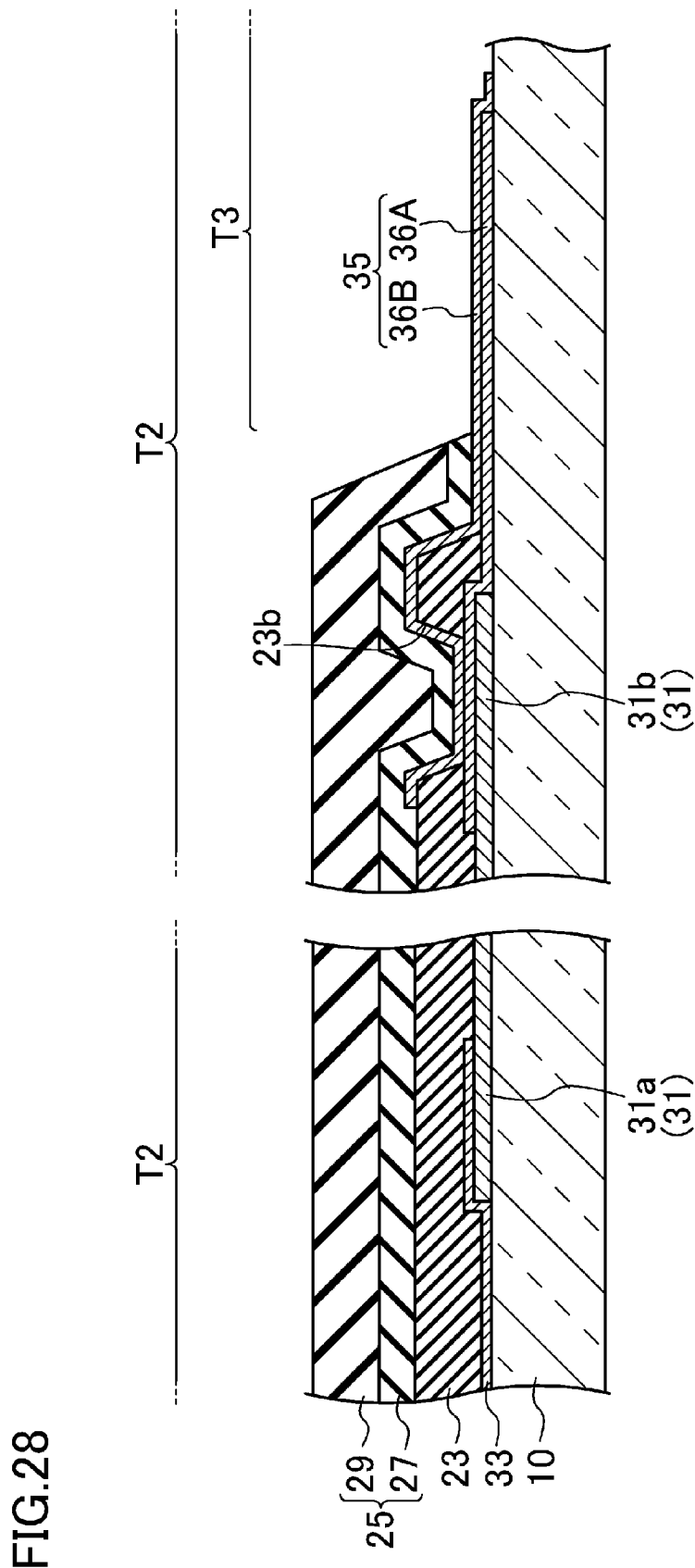
FIG. 28 is a cross-sectional view illustrating the cross-sectional structure taken along the line XXVIIIA-XXVIIIA of FIG. 26 on the right, and the cross-sectional structure taken along the line XXVIIIB-XXVIIIB of FIG. 26 on the left.

FIG. 26 is an enlarged top view illustrating the connection between each lead line 31 and connecting terminals 33 and 35 connected to the both ends of the lead line 31 in a touch panel TP according to a second embodiment. FIG. 27 is a cross-sectional view illustrating the cross-sectional structure taken along the line XXVII-XXVII of FIG. 26. FIG. 28 is a cross-sectional view illustrating the cross-sectional structure taken along the line XXVIIIA-XXVIIIA of FIG. 26 on the right, and the cross-sectional structure taken along the line XXVIIIB-XXVIIIB of FIG. 26 on the left.

In this embodiment, the structure of the touch panel TP partially differs from that in the above-described first embodiment, and the other elements are similar to those in the first embodiment. Only the portions of the touch panel having the different structure will be thus described. In the following embodiments, the same reference characters as those shown in FIGS. 1-25 are used to represent equivalent elements, and the detailed explanation thereof is to be referred to the first embodiment and will be omitted.

In the above-described first embodiment, the first interconnect layers 36A of the external connecting terminals 35 and the internal connecting terminals 33 are provided under the lead lines 31 and connected to the lower surfaces of the lead lines 31. In this embodiment, first interconnect layers 36A and internal connecting terminals 33 are provided on lead lines 31 and connected to the upper surfaces of the lead lines 31.

Each first interconnect layer 36A is formed to cover a lead top 31b of the corresponding lead line 31 at the side of a terminal region T3. On the other hand, a second interconnect layer 36B is connected to the first interconnect layer 36A at the portion overlapping the lead line 31 via a contact hole 23b formed in an interlayer insulating film 23, and electrically connected to the lead line 31 via the first interconnect layer 36A. Similar to the first embodiment, the first interconnect layer 36A and the second interconnect layer 36B extend to the terminal region T3 and are stacked one on the other.

Manufacturing Method

A method of manufacturing the touch panel TP according to this embodiment will be described below with reference to FIGS. 29-32. Similar to the first embodiment, a touch panel formation step St1 of forming the touch panel TP includes first to fifth patterning steps. FIGS. 29-32 sequentially show the first to fourth patterning steps. In FIGS. 29-32, the left corresponds to FIG. 5, and the right corresponds to FIG. 9. The fifth patterning step is similar to the above-described embodiment and thus, the explanation thereof will be omitted.

First Patterning Step

For example, a molybdenum-niobium (MoNb) alloy film, an aluminum (Al) film, and a molybdenum-niobium (MoNb) alloy film; a molybdenum nitride (MoN) film, an aluminum (Al) film, and a molybdenum nitride (MoN) film; or a molybdenum (Mo) film, an aluminum (Al) film, and a molybdenum (Mo) film are sequentially formed by sputtering on an insulating substrate 10, which has been prepared in advance, thereby forming a metal multilayer film 53 shown in FIG. 29A. Then, the metal multilayer film 53 is patterned using a first photomask to form the lead lines 31 as shown in FIG. 29B.

Second Patterning Step

A transparent conductive film 51 shown in FIG. 30A and made of, for example, ITO or IZO is formed by sputtering on the insulating substrate 10 provided with the lead lines 31 to cover the insulating substrate 10. Then, the transparent conductive film 51 is patterned using the first photomask, thereby forming first electrodes 11, first connecting portions 13, and second electrodes 17 to form first electrode groups 15 and second electrode groups 21, and forming the internal connecting terminals 33 and the first interconnect layers 36A to partially overlap and to be connected to the lead lines 31 as shown in FIG. 30B.

Third Patterning Step

An insulating film 54 shown in FIG. 31A and made of, for example, silicon nitride (SiN) is formed by CVD on the substrate provided with the first electrodes 11, the first connecting portions 13, the second electrodes 17, the internal connecting terminals 33, and the first interconnect layers 36A to cover these elements and the lead lines 31. Next, the insulating film 54 is patterned using a third photomask to form contact holes 23a and 23b in the insulating film 54 as shown in FIG. 31B to expose the corners of the second electrodes 17, and partially expose the first interconnect layers 36A at the portions overlapping the lead tops 31b of the lead lines 31. At the same time, the portion of the insulating film in the terminal region T3 is removed to expose the first interconnect layers 36A from the insulating film 54, thereby forming the interlayer insulating film 23 from the insulating film 54.

Fourth Patterning Step

As shown in FIG. 32A, a transparent conductive film 55 made of, for example, ITO or IZO is formed by sputtering on the substrate provided with the interlayer insulating film 23. The transparent conductive film 55 is patterned using a fourth photomask to form, as shown in FIG. 32B, the second connecting portions 19 to be connected to the second electrodes 17 via the contact holes 23a, and the second interconnect layers 36B to be connected to the first interconnect layers 36A via the contact holes 23b and to cover the first interconnect layers 36A in the terminal region T3, thereby forming the external connecting terminals 35.

After that, a fifth patterning step similar to that in the first embodiment is performed to manufacture the touch panel TP according to this embodiment.

Advantages of Second Embodiment

In this second embodiment, each external connecting terminal 35 has the parallel connection structure of the first interconnect layer 36A and the second interconnect layer 36B, which are connected in parallel to the lead line 31, and has the multilayer formed by stacking the first interconnect layer 36A and the second interconnect layer 36B in the terminal region T3, thereby providing advantages similar to those of the first embodiment.

First Variation of Second Embodiment

Figure 33:
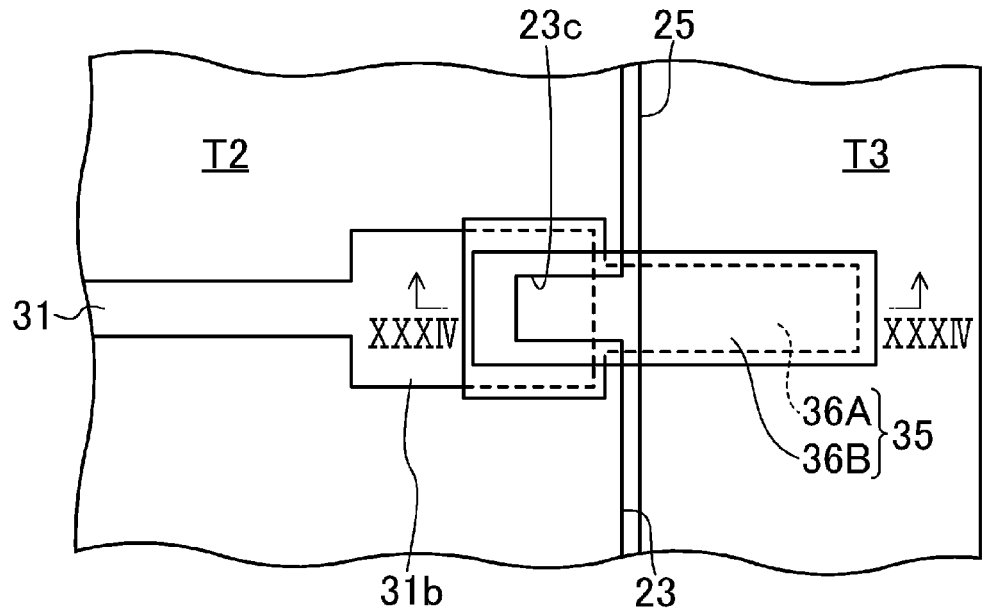
FIG. 33 is an enlarged top view illustrating the connection between an external connecting terminal and a lead line in a touch panel according to a first variation of the second embodiment.
Figure 34:
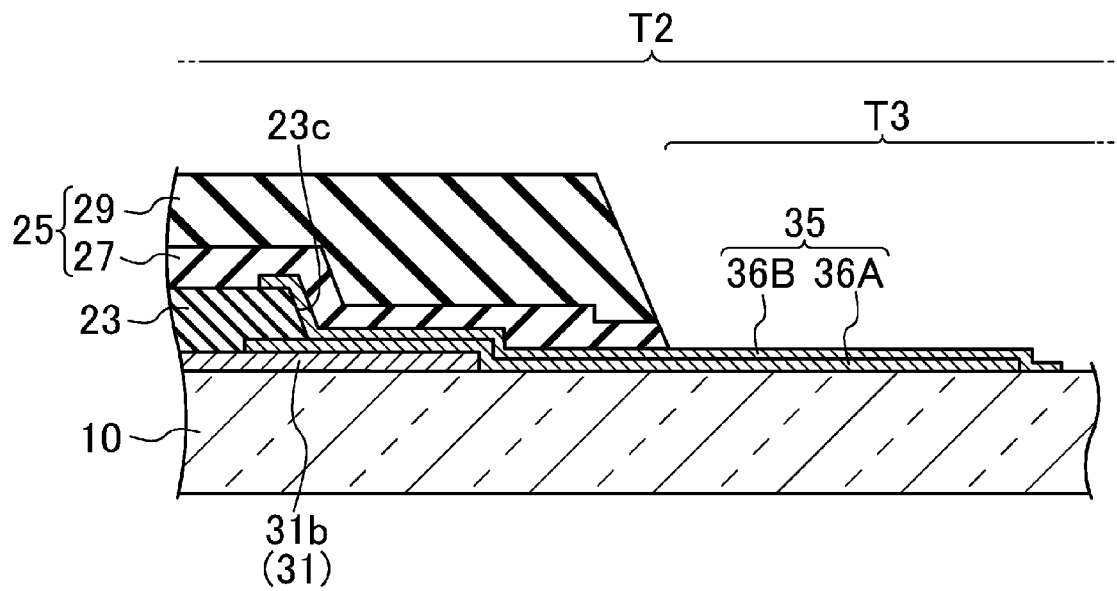
FIG. 34 is a cross-sectional view illustrating the cross-sectional structure taken along the line XXXIV-XXXIV of FIG. 33.

FIG. 33 is an enlarged top view illustrating the connection between each external connecting terminal 35 and a lead line 31 in a touch panel TP according to a first variation. FIG. 34 is a cross-sectional view illustrating the cross-sectional structure taken along the line XXXIV-XXXIV of FIG. 33.

The above-described second embodiment shows that the second interconnect layer 36B of each external connecting terminal 35 is connected to the first interconnect layer 36A via the contact hole 23b formed in the interlayer insulating film 23. In this variation, for example, a rectangular cutout portion 23c, which is open outside the outer edge of an interlayer insulating film 23, is formed in the interlayer insulating film 23 instead of the contact hole 23a, and a second interconnect layer 36B is connected to a first interconnect layer 36A via the cutout portion 23c at the portion overlapping the lead line 31.

Advantages of First Variation of Second Embodiment

In this first variation, as compared to the first embodiment where each second interconnect layer 36B is connected to the corresponding lead line 31 via the contact hole 23b formed in the interlayer insulating film 23, the contact area between the second interconnect layer 36B and the lead line 31 increases, since the cutout portion 23c is open outside the outer edge of the interlayer insulating film 23. This reduces the contact resistance between the second interconnect layer 36B and the lead line 31. As a result, poor conduction between the external connecting terminal 35 and the lead line 31 is greatly reduced.

Second Variation of Second Embodiment

Figure 35:
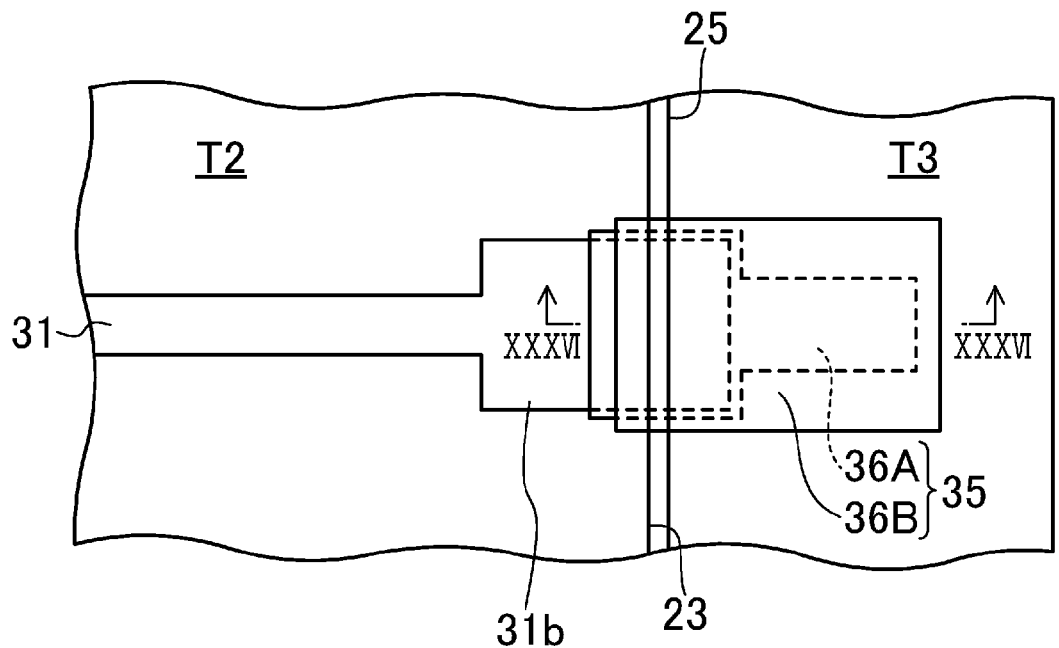
FIG. 35 is an enlarged top view illustrating the connection between an external connecting terminal and a lead line in a touch panel according to a second variation of the second embodiment.
Figure 36:
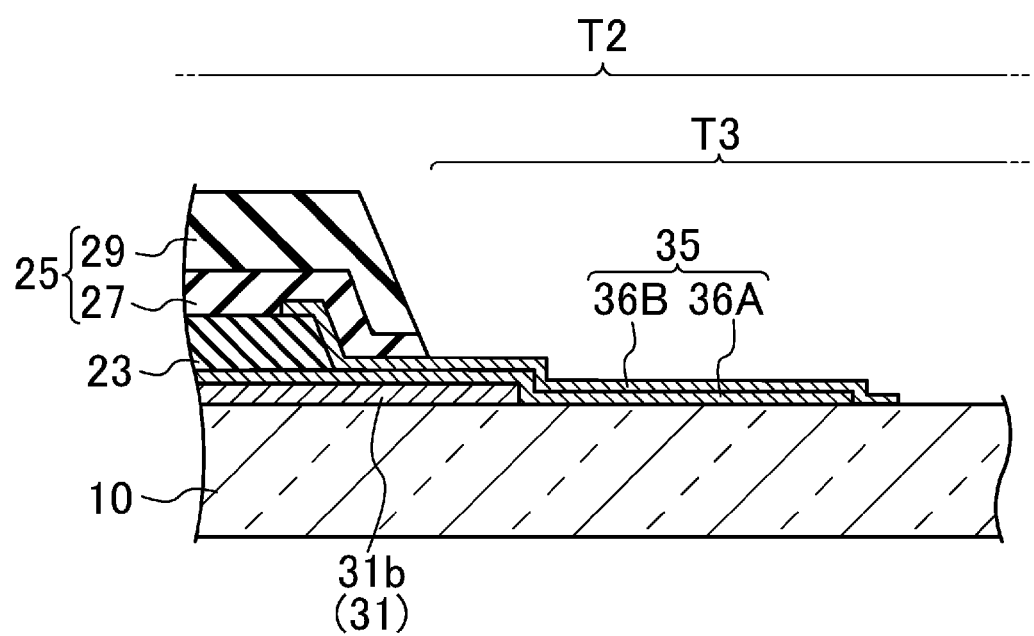
FIG. 36 is a cross-sectional view illustrating the cross-sectional structure taken along the line XXXVI-XXXVI of FIG. 35.

FIG. 35 is an enlarged top view illustrating the connection between each external connecting terminal 35 and a lead line 31 in a touch panel TP according to a second variation. FIG. 36 is a cross-sectional view illustrating the cross-sectional structure taken along the line XXXVI-XXXVI of FIG. 35.

The above-described second embodiment shows that each entire lead line 31 is located inside the interlayer insulating film 23. In this variation, a lead top 31b of the lead line 31 partially extends beyond an interlayer insulating film 23 and a protection insulating film 25 to a terminal region T3 located outside the interlayer insulating film 23 and the protection insulating film 25. A first interconnect layer 36A and a second interconnect layer 36B cover the entire extending portion of the lead line 31.

Advantages of Second Variation of Second Embodiment

In this second variation, although being located outside the interlayer insulating film 23 and the protection insulating film 25, the extending portion of the lead line 31 is protected from moisture etc., by the first interconnect layer 36A and the second interconnect layer 36B covering the extending portion, and is less corroded. In this structure, in which the lead top 31b of the lead line 31 at least partially extends outside the insulating films 23 and 25, the width of the picture-frame region T2 at the terminal region T3 can be reduced as compared to the structure in which the entire lead line 31 is inside the insulating films 23 and 25.

Third Variation of Second Embodiment

Figure 37:
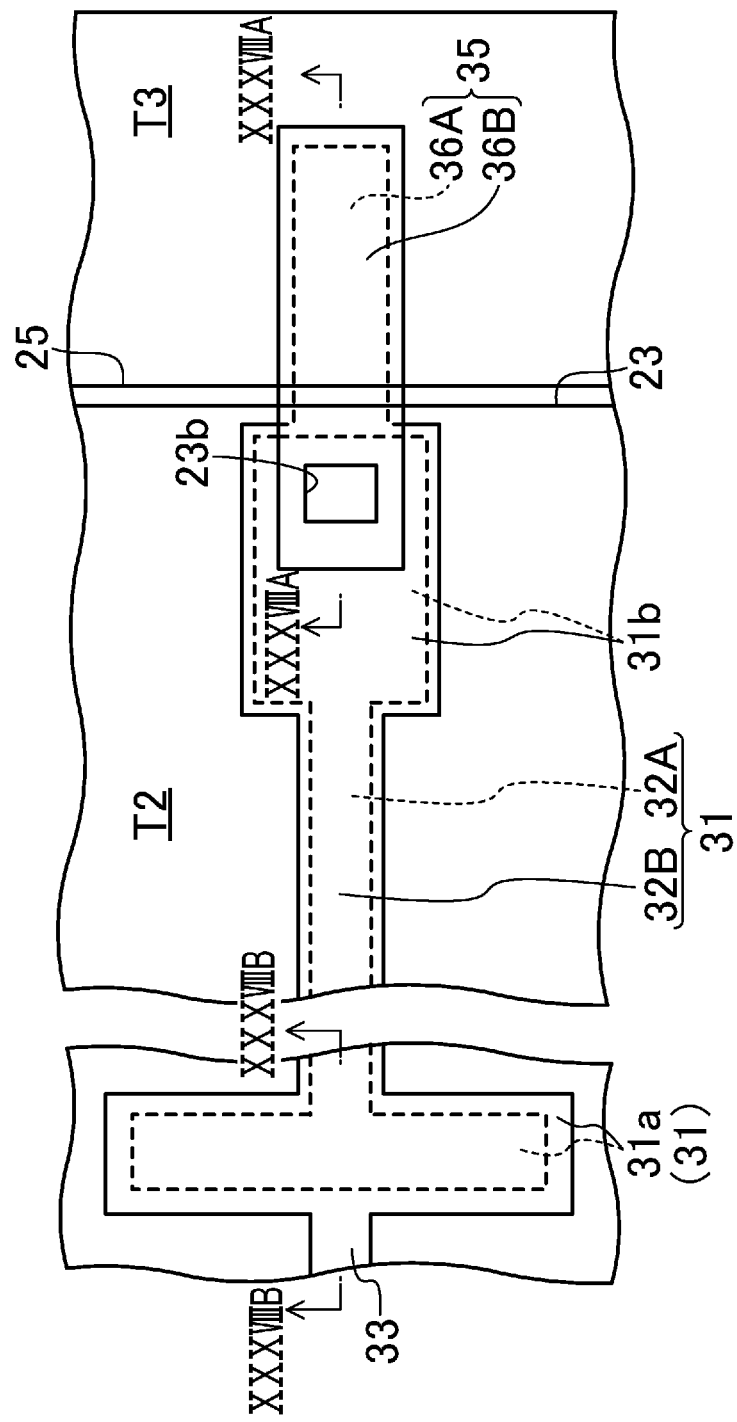
FIG. 37 is an enlarged top view illustrating is an enlarged top view illustrating the connection between a lead line and connecting terminals connected at its ends in a touch panel according to a third variation of the second embodiment.
Figure 38:
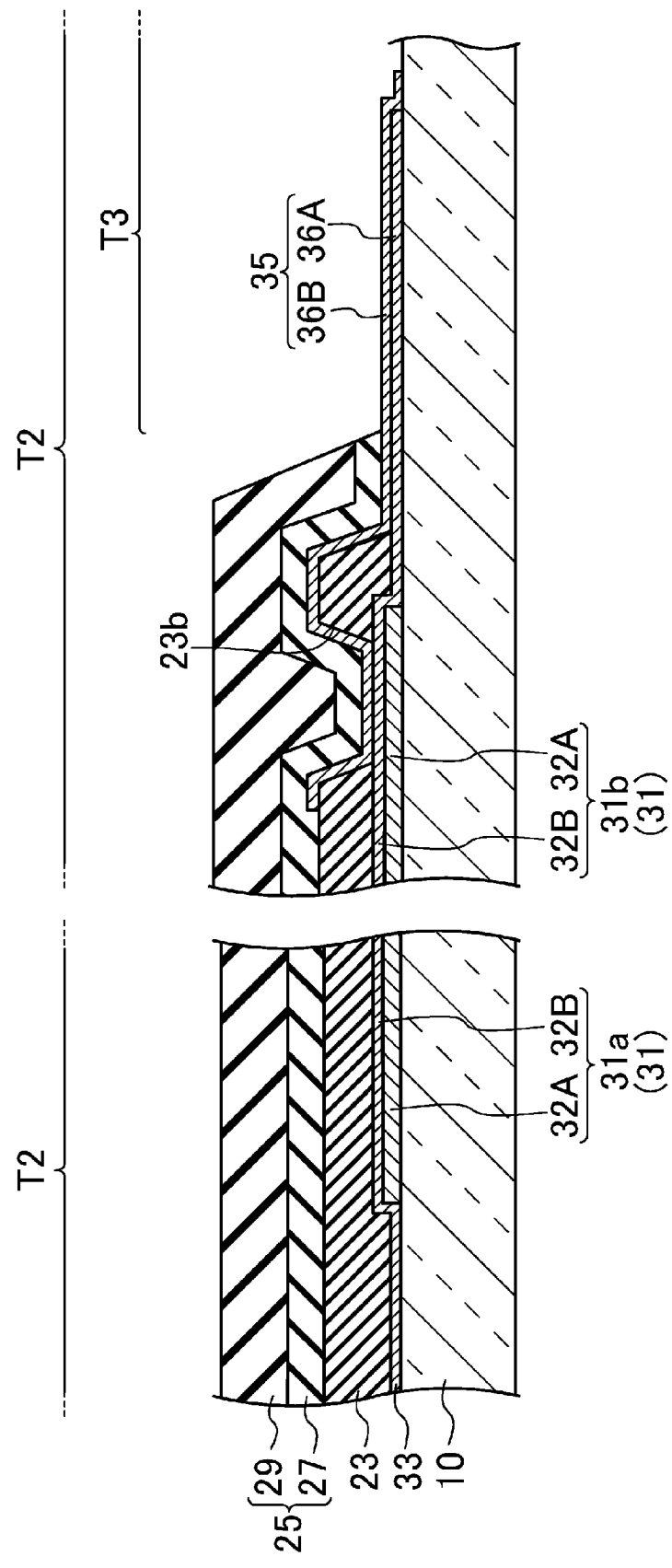
FIG. 38 is a cross-sectional view illustrating the cross-sectional structure taken along the line XXXVIIIA-XXXVIIIA of FIG. 37 on the right, and the cross-sectional structure taken along the line XXXVIIIB-XXXVIIIB of FIG. 37 on the left.

FIG. 37 is an enlarged top view illustrating the connection between each lead line 31 and connecting terminals 33 and 35 connected to the both ends of the lead line 31 in a touch panel TP according to a third variation. FIG. 38 is a cross-sectional view illustrating the cross-sectional structure taken along the line XXXVIIIA-XXXVIIIA of FIG. 37 on the right, and the cross-sectional structure taken along the line XXXVIIIB-XXXVIIIB of FIG. 37 on the left.

Similar to the first embodiment, in the above-described second embodiment, the lead line 31 is formed by stacking only a plurality of metal layers patterned together. In this variation, the lead line 31 is formed by stacking a lower interconnect layer 32A formed of a plurality of metal layers (e.g., MoNb/Al/MoNb, MoN/Al/MoN, Mo/Al/Mo) similar to those of the lead lines 31 in the second embodiment, and an upper interconnect layer 32B formed of the same film as first electrode groups 15 (i.e., first electrodes 11), first connecting portions 13, second electrode groups 21 (i.e., second electrodes 17), and internal connecting terminals 33.

The upper interconnect layer 32B is integrally formed with each internal connecting terminal 33 and a first interconnect layer 36A to connect the internal connecting terminal 33 and the first interconnect layer 36A together. In this variation, the lower interconnect layer 32A is the second interconnect layer of the present disclosure, and the upper interconnect layer 32B is the first interconnect layer of the present disclosure.

Such a touch panel TP is manufactured by forming the lower interconnect layer 32A in the first patterning step of the second embodiment, and by forming the upper interconnect layer 32B from a transparent conductive film 51 together with the first electrodes 11 and the second electrodes 17 in the second patterning step.

Advantages of Third Variation of Second Embodiment

In this third variation, the lead line 31 has the multilayer of the lower interconnect layer 32A and the upper interconnect layer 32B. Thus, as compared to the first embodiment where each lead line 31 is a layer made of only metal materials similar to those of the lower interconnect layer 32A, the lead line 31 is thick since the multilayer has one layer (i.e., the upper interconnect layer 32B) more to form the lead line 31. This reduces the resistance of the lead line 31. As a result, poor conduction between a controller 41 and the first and second electrode groups 15 and 21 is more reliably prevented.

Formed of the same film as the first electrodes 11 and the second electrodes 17, the upper interconnect layer 32B can be formed together with the first electrodes 11 and the second electrodes 17 not to increase the manufacturing steps.

Fourth Variation of Second Embodiment

Figure 39:
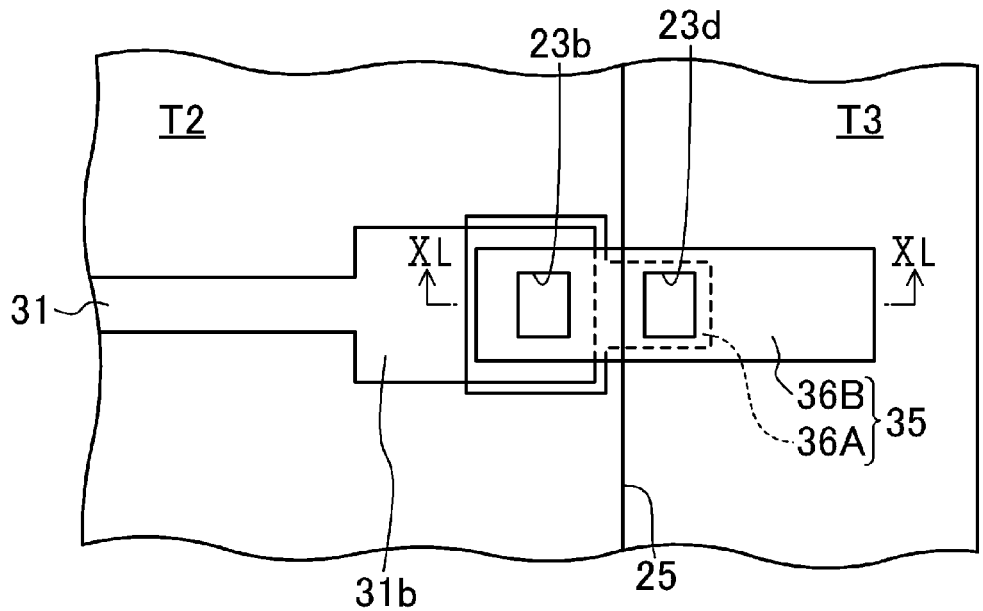
FIG. 39 is an enlarged top view illustrating the connection between an external connecting terminal and a lead line in a touch panel according to a fourth variation of the second embodiment.
Figure 40:
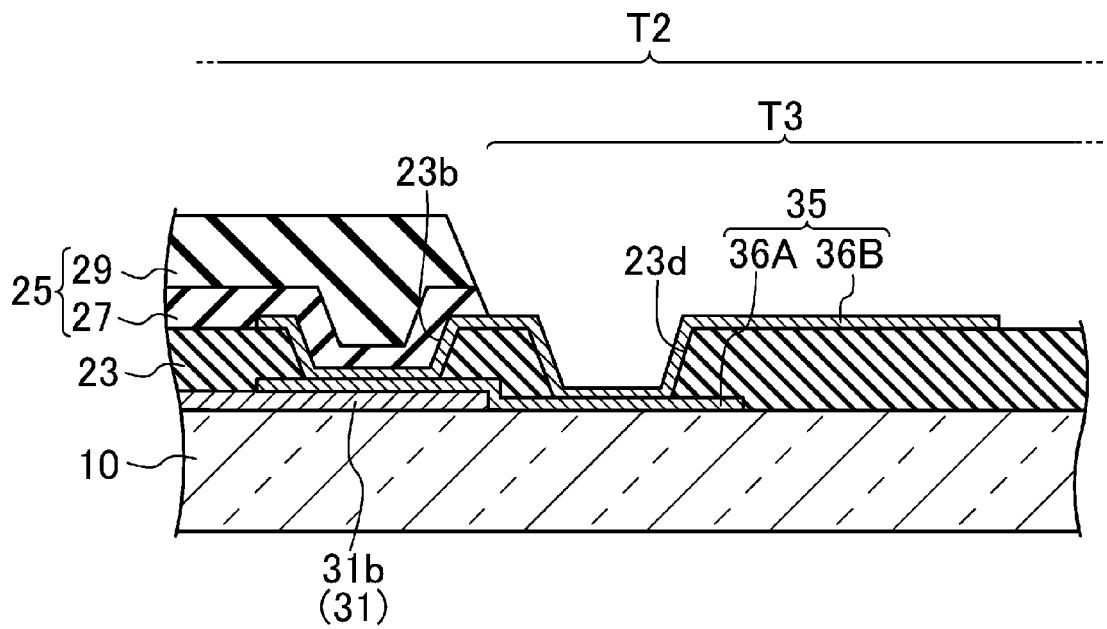
FIG. 40 is a cross-sectional view illustrating the cross-sectional structure taken along the line XL-XL of FIG. 39.

FIG. 39 is an enlarged top view illustrating the connection between each external connecting terminal 35 and a lead line 31 in a touch panel TP according to a fourth variation. FIG. 40 is a cross-sectional view illustrating the cross-sectional structure taken along the line XL-XL of FIG. 39.

In the above-described second embodiment, the interlayer insulating film 23 is not formed in the terminal region T3. In this variation, an interlayer insulating film 23 is also formed in a terminal region T3. In this variation as well, a protection insulating film 25 is not formed in the terminal region T3, and a first interconnect layer 36A and a second interconnect layer 36B extend beyond the protection insulating film 25 to the terminal region T3 located outside the protection insulating film 25. The second interconnect layer 36B is provided on the interlayer insulating film 23 in the terminal region T3 as well, and is connected to the first interconnect layer 36A via a contact hole 23d formed in the interlayer insulating film 23.

Advantages of Fourth Variation of Second Embodiment

In this fourth variation, the external connecting terminal 35 has a parallel connection structure of the first interconnect layer 36A and the second interconnect layer 36B, which are connected in parallel to the lead line 31. This reduces the electrical resistance of the external connecting terminal 35 without increasing the manufacturing costs, thereby providing an excellent function of touch position detection.

Fifth Variation of Second Embodiment

Figure 41:
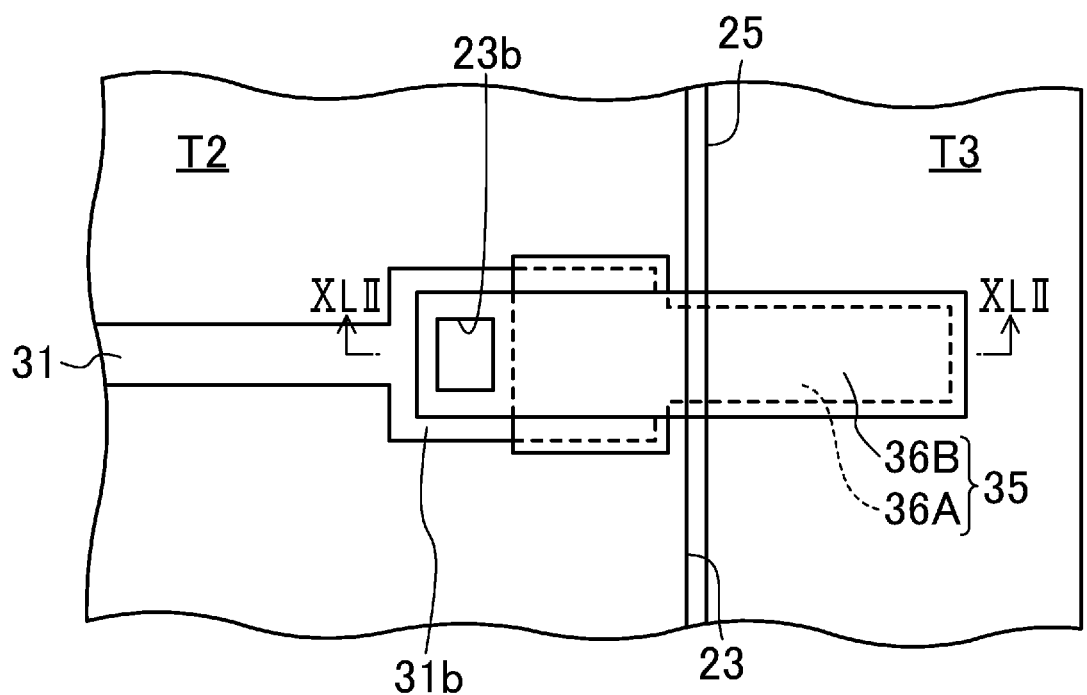
FIG. 41 is an enlarged top view illustrating the connection between an external connecting terminal and a lead line in a touch panel according to a fifth variation of the second embodiment.
Figure 42:
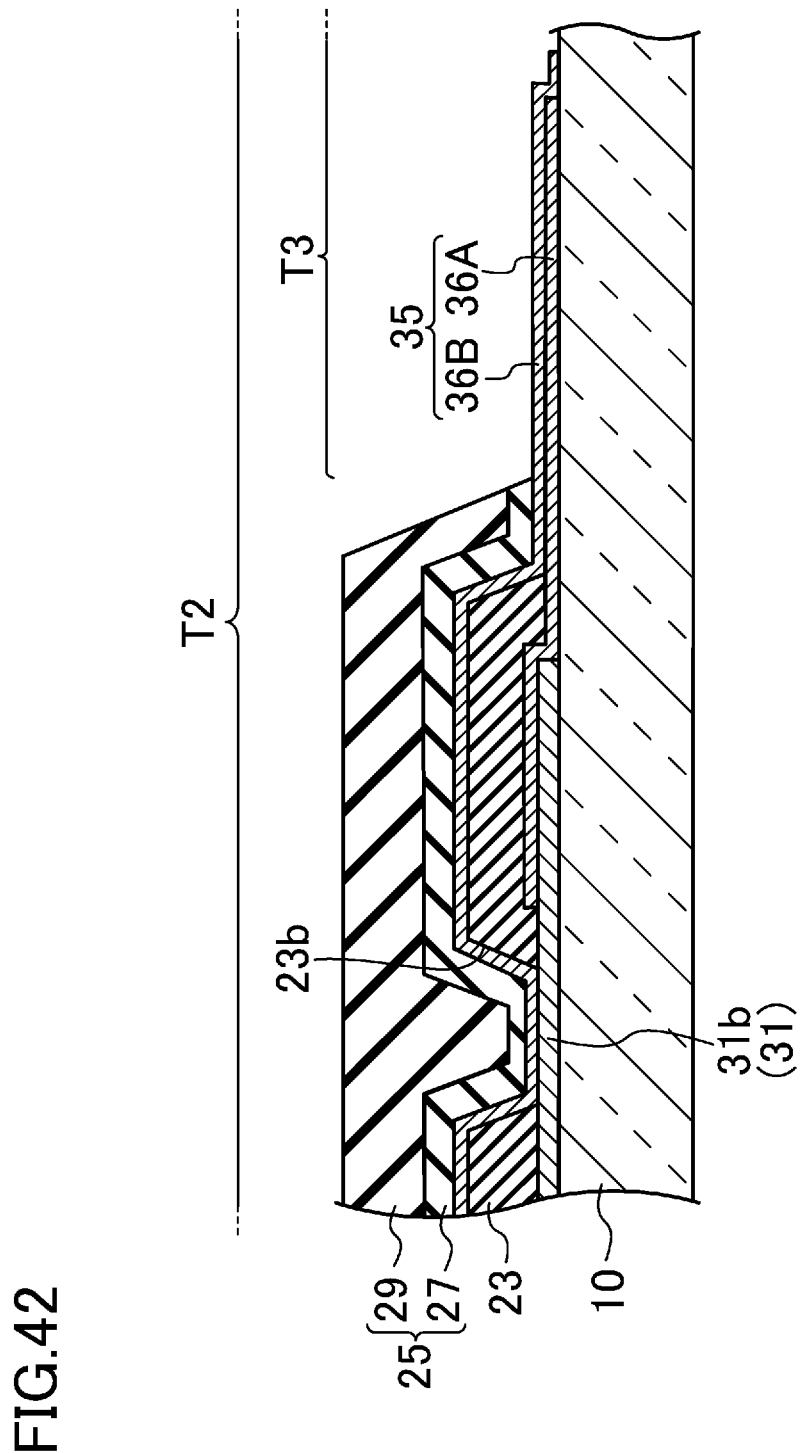
FIG. 42 is a cross-sectional view illustrating the cross-sectional structure taken along the line XLII-XLII of FIG. 41.

FIG. 41 is an enlarged top view illustrating the connection between each external connecting terminal 35 and a lead line 31 in a touch panel TP according to a fifth variation. FIG. 42 is a cross-sectional view illustrating the cross-sectional structure taken along the line XLII-XLII of FIG. 41.

In the above-described second embodiment, each second interconnect layer 36B is connected to the corresponding lead line 31 at the portion overlapping the first interconnect layer 36A. In this variation, a first interconnect layer 36A and a second interconnect layer 36B are electrically connected to the lead line 31 at different portions. Specifically, a contact hole 23b reaching a lead top 31b of the lead line 31 is formed at an inner portion of the interlayer insulating film 23 as compared to the first interconnect layer 36A (FIG. 41 and the left of FIG. 42), and the second interconnect layer 36B is connected to the lead line 31 via the contact hole 23b at the back of (in a position closer to the lead base than) the first interconnect layer 36A.

Such a touch panel TP is manufactured by forming the contact hole 23b to partially expose the lead top 31b of the lead line 31 at the portion overlapping the lead line 31 at inner portion of the interlayer insulating film 23 as compared to the first interconnect layer 36A in the third patterning step of the second embodiment, and by forming the second interconnect layer 36B to be connected to the lead line 31 via the contact hole 23b in the fourth patterning step.

Advantages of Fifth Variation of Second Embodiment

In this fifth variation, the external connecting terminal 35 has a parallel connection structure of the first interconnect layer 36A and the second interconnect layer 36B, which are connected in parallel to the lead line 31. This reduces the electrical resistance of the external connecting terminal 35 without increasing the manufacturing costs, thereby providing an excellent function of touch position detection.

Other Embodiments

The following structures and manufacturing methods are applicable to the first and second embodiments, and the variations.

Location of Lead Line 31

FIGS. 43-46 illustrate the connection between each lead line 31 and connecting terminals 33 and 35 connected to the both ends of the lead line 31 in a touch panel TP according to other embodiments.

Figure 43:
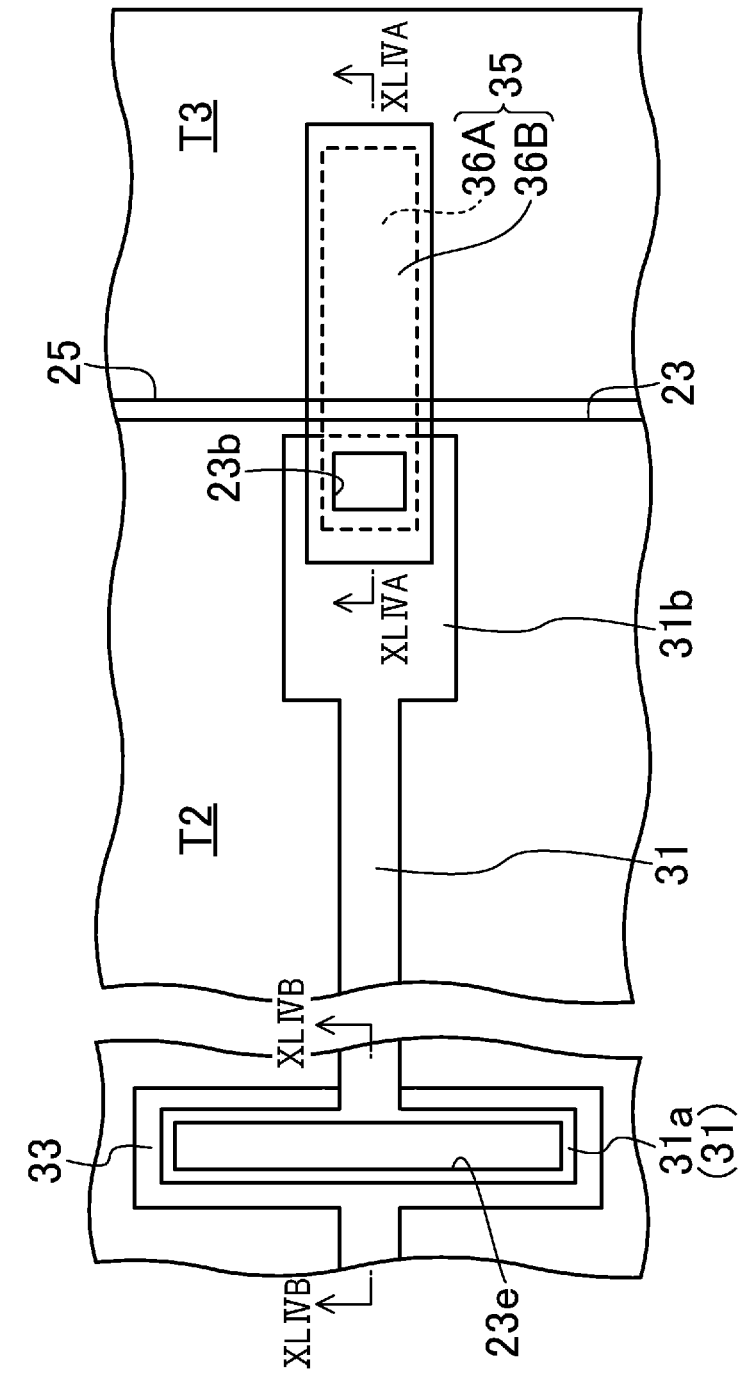
FIG. 43 is an enlarged top view illustrating a first aspect of the connection between an external connecting terminal and a lead line in a touch panel according to another embodiment.
Figure 44:
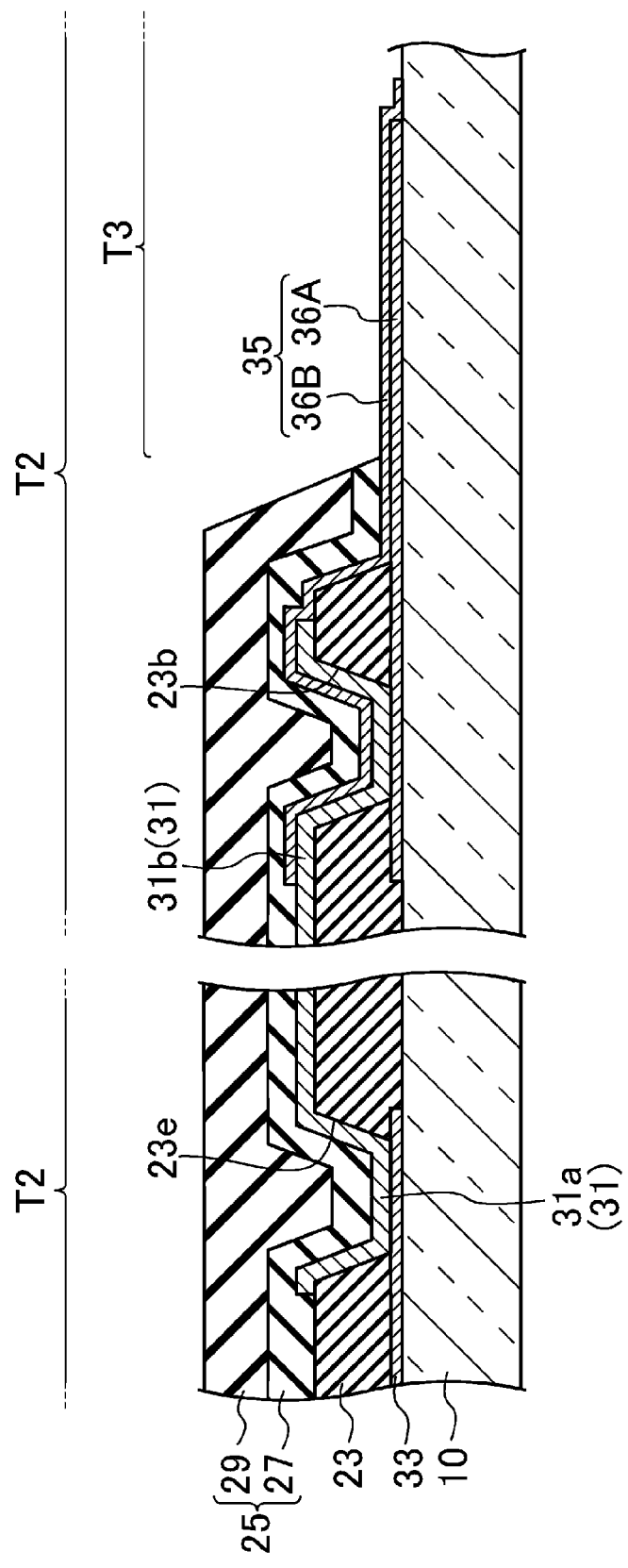
FIG. 44 is a cross-sectional view illustrating the cross-sectional structure taken along the line XLIV-XLIV of FIG. 43.
Figure 45:
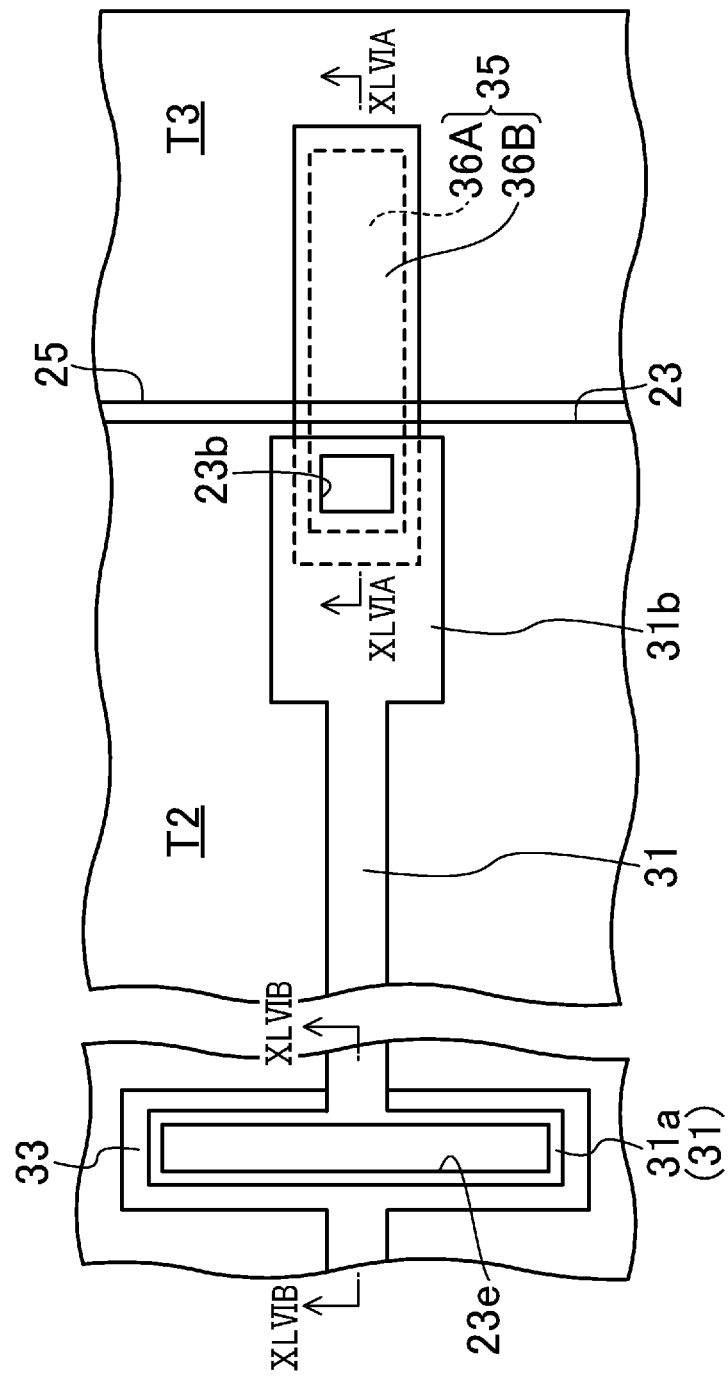
FIG. 45 is an enlarged top view illustrating a second aspect of the connection between an external connecting terminal and a lead line in the touch panel according to the other embodiment.
Figure 46:
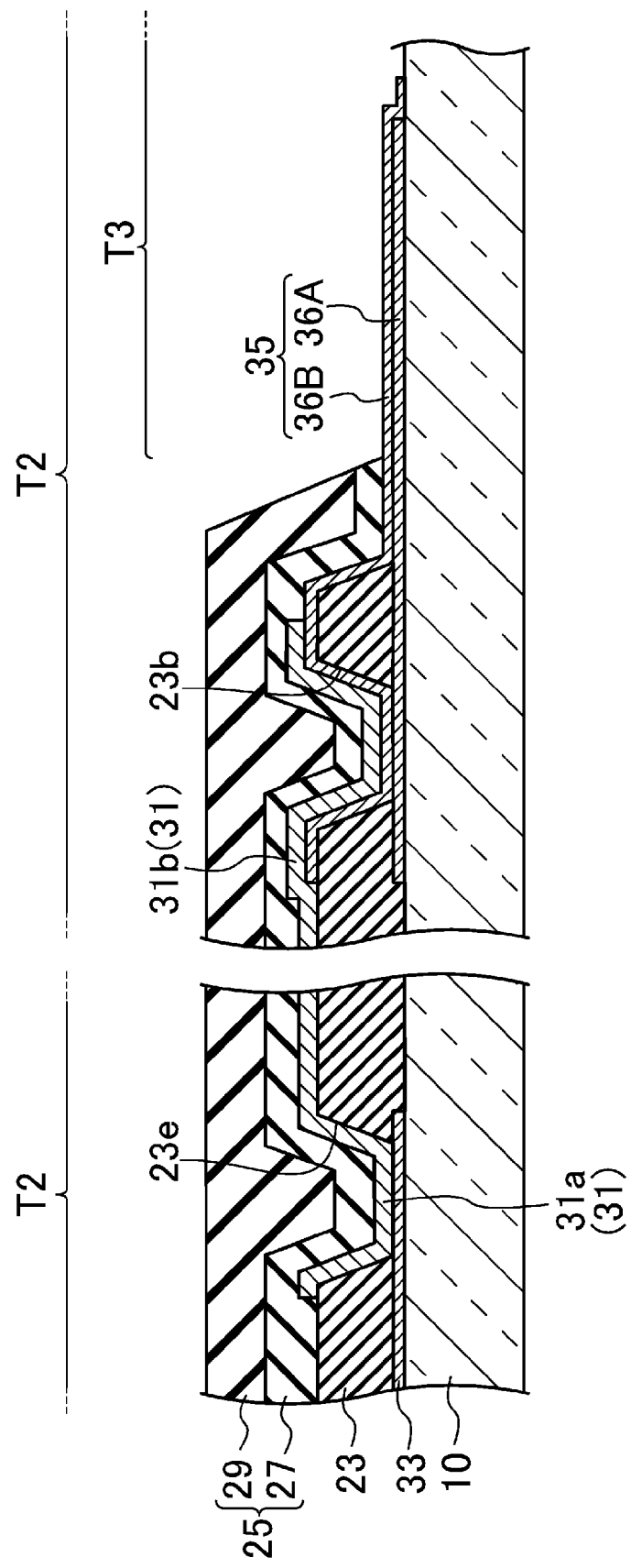
FIG. 46 is a cross-sectional view illustrating the cross-sectional structure taken along the line XLVI-XLVI of FIG. 45.

FIG. 43 is a cross-sectional view illustrating a first aspect of the connection between each lead line 31 and terminals 33 and 35 connected to the both ends of the lead line 31. FIG. 44 is a cross-sectional view illustrating the cross-sectional structure taken along the line XLVIA-XLVIA of FIG. 43 on the right, and the cross-sectional structure taken along the line XLVIB-XLVIB of FIG. 43 on the left. FIG. 45 is a cross-sectional view illustrating a second aspect of the connection between each lead line 31 and terminals 33 and 35 connected to the both ends of the lead line 31. FIG. 46 is a cross-sectional view illustrating the cross-sectional structure taken along the line XLVIA-XLVIA of FIG. 45 on the right, and the cross-sectional structure taken along the line XLVIB-XLVIB of FIG. 45 on the left.

While, in the above-described first and second embodiments and the variations, an example has been described where each lead line 31 is provided under the interlayer insulating film 23, the present disclosure is not limited thereto. For example, as shown in FIGS. 43 and 44, each lead line 31 may be provided on an interlayer insulating film 23 and connected to a first interconnect layer 36A via a contact hole 23b formed in the interlayer insulating film 23, and a second interconnect layer 36B may be provided on the lead line 31 and connected to the upper surface of the lead line 31. In this case, the lead line 31 is connected to an internal connecting terminal 33 via a contact hole 23e formed in the interlayer insulating film 23 at the portion overlapping a lead base end 31a of the lead line 31.

Alternatively, as shown in FIGS. 45 and 46, a second interconnect layer 36B may be provided under a lead line 31 and connected to the lower surface of the lead line 31, and a first interconnect layer 36A may be electrically connected the lead line 31 via the second interconnect layer 36B.

In the above-described structures as well, each external connecting terminal 35 has a parallel connection structure of the first interconnect layer 36A and the second interconnect layer 36B, which are connected in parallel to the lead line 31. This reduces the electrical resistance of the external connecting terminal 35 without increasing the manufacturing costs, thereby providing an excellent function of touch position detection.

Location of First Electrode Groups 15, First Connecting Portions 13, Second Electrode Groups 21, and Second Connecting Portions 19

Figure 47:
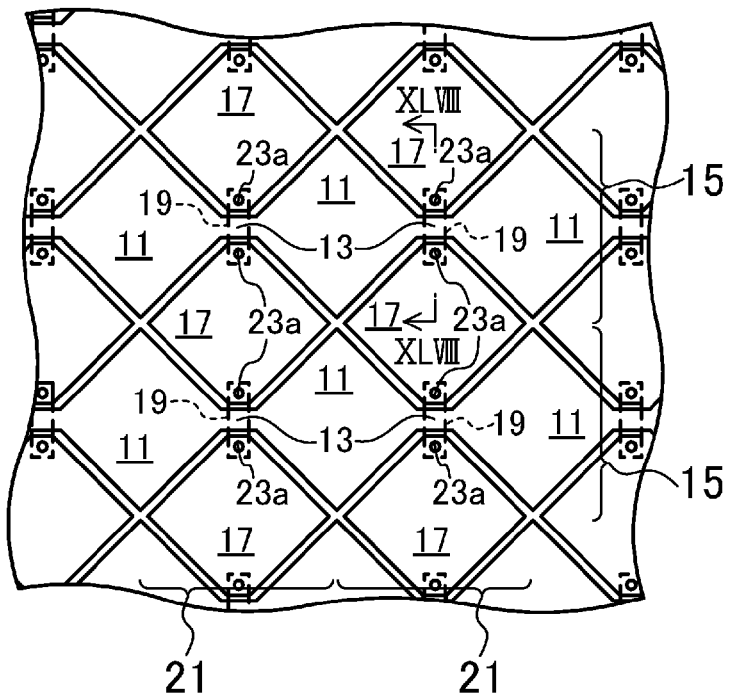
FIG. 47 is an enlarged top view illustrating a touch region in the touch panel according to the other embodiment.
Figure 48:
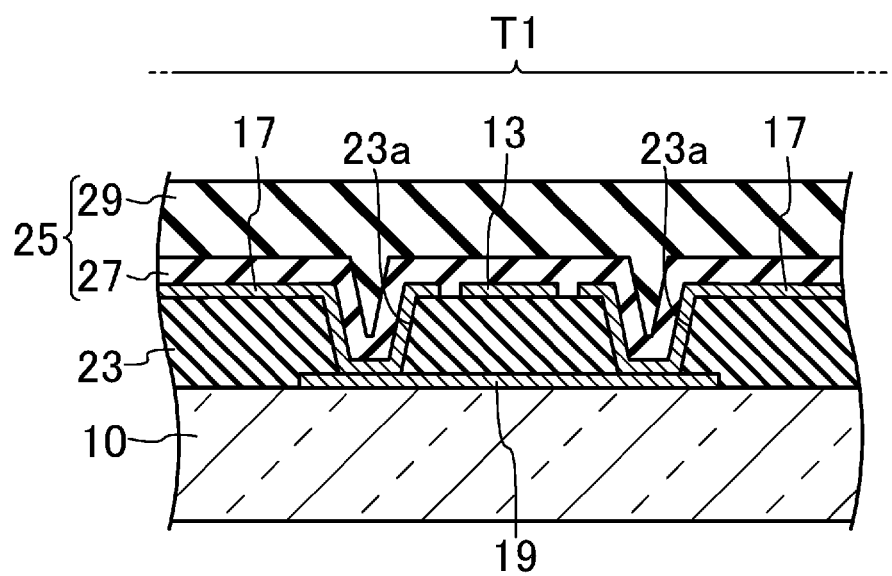
FIG. 48 is a cross-sectional view illustrating the cross-sectional structure taken along the line XLVIII-XLVIII of FIG. 47.

FIG. 47 is an enlarged top view illustrating a touch region T1 of a touch panel TP according to another embodiment. FIG. 48 is a cross-sectional view illustrating the cross-sectional structure taken along the line XLVIII-XLVIII of FIG. 47.

While in the above-described first and second embodiments and the variations, an example has been described where the first electrode groups 15 (i.e., the first electrodes 11), the first connecting portions 13, and the second electrode groups 21 (i.e., the second electrodes 17) are provided under the interlayer insulating film 23, and the second connecting portions 19 are provided on the interlayer insulating film 23, the present disclosure is not limited thereto. For example, as shown in FIGS. 47 and 48, a reversed structure is also applicable, in which second connecting portions 19 are provided under an interlayer insulating film 23, and first electrode groups 15 (i.e., first electrodes 11), first connecting portions 13, and second electrode groups 21 (i.e., second electrodes 17) are provided on the interlayer insulating film 23. In this case, the second connecting portions 19 form the first conductive pattern of the present disclosure, and the first electrode groups 15 (i.e., the first electrodes 11), the first connecting portions 13, and the second electrode groups 21 (i.e., the second electrodes 17) form the second conductive pattern of the present disclosure. In the touch panel TP having the reversed structure, a first interconnect layer 36A is formed of the same film as the second connecting portions 19, and a second interconnect layer 36B is formed of the same film as the first electrode groups 15 (i.e., the first electrodes 11), the first connecting portions 13, and the second electrode groups 21 (i.e., the second electrodes 17).

Similar to the first embodiment, in such a touch panel TP having the reversed structure, the first electrode groups 15 and the second electrode groups 21 are provided in the same layer, thereby enabling highly sensitive detection of a touch position.

Alternatively, first electrode groups 15 (i.e., first electrodes 11) and first connecting portions 13 may be provided under an interlayer insulating film 23, and second electrode groups 21 (i.e., second electrodes 17) and second connecting portions 19 may be provided on the interlayer insulating film 23. In this case, the first electrode groups 15 (i.e., the first electrodes 11) and the first connecting portions 13 form the first conductive pattern of the present disclosure, and the second electrode groups 21 (i.e., the second electrodes 17) and the second connecting portions 19 form the second conductive pattern of the present disclosure. In the touch panel TP with this structure, a first interconnect layer 36A is formed of the same film as the first electrode groups 15 (i.e., the first electrodes 11) and the first connecting portions 13, and a second interconnect layer 36B is formed of the same film as the second electrode groups 21 (i.e., the second electrodes 17) and the second connecting portions 19.

Structure of Touch Panel TP in Liquid Crystal Display Device S

While in the above-described first and second embodiments and the variations, an example has been described where the touch panel TP is directly formed on the outer surface of the counter substrate 3, the present disclosure is not limited thereto. A touch panel TP may be formed on a transparent substrate such as a glass substrate different from the counter substrate 3, and the touch panel TP may be bonded to the counter substrate 3, thereby forming a liquid crystal display device S.

Method of Manufacturing Liquid Crystal Display Device S

In the above-described first embodiment, in the bonding step St4, the liquid crystal display panel DP is fabricated by what is called "one drop filling," in which the TFT substrate 1 is bonded to the counter substrate 3 via the sealing material 5 and the liquid crystal material, after dispensing in a frame-like form, the sealing material 5 on the TFT substrate 1 or the counter substrate 3, and dropping a liquid crystal material inside the sealing material 5. Instead, the liquid crystal display panel DP may be fabricated by what is called "vacuum injection," in which a sealing material is applied to the TFT substrate 1 or the counter substrate 3 in a substantially frame-like form having a cutout portion, and the TFT substrate 1 is boded to the counter substrate 3 via the sealing material to form a bond including void cells; a liquid crystal material is injected to the void cells of the bond from an inlet, which is the cutout portion of the sealing material, by utilizing a pressure difference caused by vacuuming; and then the inlet is sealed by a sealing material.

While in the above-described first embodiment, the touch panel formation step St1 is performed before the counter substrate formation step St2, the present disclosure is not limited thereto. The touch panel formation step St1 may be performed after the bonding step St4. That is, a touch panel TP may be manufactured by forming by repeated known photolithography, the first electrodes 11, the first connecting portions 13, the second electrodes 17, the internal connecting terminals 33, the lead lines 31, the interlayer insulating film 23, the second connecting portions 19, the external connecting terminals 35 (each including the first interconnect layer 36A and the second interconnect layer 36B), and the protection insulating film 25 on the surface of a bond formed by bonding the TFT substrate 1 to the counter substrate 3.

While the preferable embodiments and variation of the present disclosure have been described above, the technical scope of the present disclosure is not limited to the scope of the embodiments and variations. The embodiments and variations are mere examples, and those skilled in the art will recognize that combinations of the elements and processing processes may be variously modified and such modifications fall within the scope of the present disclosure.

For example, while the liquid crystal display device has been described as an example in the above-described first and second embodiments and the variations, the present disclosure is not limited thereto. The present disclosure is applicable not only to a liquid crystal display device, but to various display devices such as an organic electro luminescence (EL) display device, an inorganic EL display device, a plasma display device, a field emission display (FED), and a surface-conduction electron-emitter display (SED), and is widely applicable as long as the display device includes a touch panel.

INDUSTRIAL APPLICABILITY

As described above, the present disclosure is useful for a touch panel, a display device including the touch panel, and a method of manufacturing the touch panel; and is particularly suited for a touch panel, a display device including the touch panel, and a method of manufacturing the touch panel, which require an excellent function of touch position detection, while reducing the electrical resistance of external connecting terminals without increasing the manufacturing costs.

DESCRIPTION OF REFERENCE CHARACTERS

S Liquid Crystal Display Device
DP Liquid Crystal Display Panel
TP Touch Panel
T1 Touch Region
T3 Terminal Region
11 First Electrode (First Conductive Pattern)
13 First Connecting Portion (First Conductive Pattern)
15 First Electrode Group (First Conductive Pattern)
17 Second Electrode (First Conductive Pattern)
19 Second Connecting Portion (Second Conductive Pattern)
21 Second Electrode Group (First Conductive Pattern)
23 Interlayer Insulating Film
23b Contact Hole
23c Cutout Portion
25 Protection Insulating Film
31 Lead Line
31b Lead Top
35 External Connecting Terminal
36A First Interconnect Layer
36B Second Interconnect Layer
41 Controller (External Circuit)
51, 55 Transparent Conductive Film
53 Metal Multilayer Film (Metal Film)
54 Insulating Film
59 Multilayer Insulating Film (Insulating Film)

The invention claimed is:

1. A touch panel, comprising:
a touch region for detecting a touch position touched by a contact body;
a terminal region provided outside the touch region and connected to an external circuit;
a first conductive pattern for touch position detection located in the touch region and made of transparent conductive oxide;
an interlayer insulating film provided to cover at least part of the first conductive pattern;
a second conductive pattern for touch position detection provided on the interlayer insulating film and made of transparent conductive oxide;
a protection insulating film provided to cover the second conductive pattern;
a lead line electrically connected to at least one of the first conductive pattern or the second conductive pattern, drawn from the touch region to the terminal region, and covered by the interlayer insulating film and the protection insulating film; and
an external connecting terminal connected to a lead top of the lead line, drawn out of the interlayer insulating film and the protection insulating film, and provided in the terminal region, wherein
the external connecting terminal includes a first interconnect layer formed of a same film as the first conductive pattern, and a second interconnect layer formed of a same film as the second conductive pattern, the first and second interconnect layers being electrically connected to the lead line at a portion overlapping the lead line and being connected to each other in the terminal region, with surfaces thereof overlapping each other.

2. The touch panel of claim 1, wherein,
the first interconnect layer and the second interconnect layer are stacked one on another in the terminal region.

3. The touch panel of claim 1, wherein
a contact hole or a cutout portion is formed in the interlayer insulating film at a portion overlapping the lead top of the lead line, and
the second interconnect layer is electrically connected to the lead line via the contact hole or the cutout portion.

4. The touch panel of claim 1, wherein
the lead top of the lead line extends outside the interlayer insulating film and the protection insulating film, and
at least one of the first interconnect layer or the second interconnect layer covers an entire extending portion of the lead line.

5. The touch panel of claim 1, wherein
the first interconnect layer and the second interconnect layer are electrically connected to the lead line at different portions.

6. The touch panel of claim 1, wherein
the lead line is formed by stacking a first interconnect layer formed of a same film as the first conductive pattern, and a second interconnect layer made of a metal material.

7. The touch panel of claim 1, wherein
one of the first conductive pattern or the second conductive pattern includes
a plurality of first electrode groups arranged in parallel, each including a plurality of first electrodes aligned in one direction,
a plurality of second electrode groups arranged in parallel, each including a plurality of second electrodes aligned in a direction intersecting the first electrode groups, and
a first connecting portion connecting each adjacent pair of the first electrodes of the first electrode groups, and
the other one of the first conductive pattern or the second conductive pattern includes a second connecting portion connecting each adjacent pair of the second electrodes of the second electrode groups.

8. The touch panel of claim 1, wherein the transparent conductive oxide forming the first conductive pattern and the second conductive pattern is indium tin oxide or indium zinc oxide.

9. A display device comprising the touch panel of claim 1.

10. The display device of claim 9, wherein the touch panel is directly formed on a substrate surface forming a display panel.

11. A method of manufacturing the touch panel of claim 1, the method comprising:
- a first patterning step of forming the lead line by forming a metal film on a base substrate, and patterning the metal film using a first photomask;
- a second patterning step of forming the first conductive pattern, and forming the first interconnect layer to partially overlap and to be connected to the lead line by forming a transparent conductive film made of transparent conductive oxide to cover the lead line, and patterning the transparent conductive film using a second photomask;
- a third patterning step of forming the interlayer insulating film to expose at least part of the lead line or the first interconnect layer at a portion overlapping the lead line, and part of the first interconnect layer at a portion outside the lead line by forming an insulating film to cover the lead line, the first conductive pattern, and the first interconnect layer, and patterning the insulating film using a third photomask;
- a fourth patterning step of forming the second conductive pattern, and forming the second interconnect layer to be connected to the lead line or the first interconnect layer at a portion overlapping the lead line, and to the first interconnect layer at a portion outside the lead line by forming a transparent conductive film made of transparent conductive oxide on the interlayer insulating film, and patterning the transparent conductive film using a fourth photomask; and
- a fifth patterning step of forming the protection insulating film to expose at least part of the second interconnect layer by forming an insulating film to cover the second conductive pattern and the second interconnect layer, and patterning the insulating film using a fifth photomask.

\* \* \* \* \*